United States Patent
Konishi et al.

(10) Patent No.: US 6,934,522 B2
(45) Date of Patent: Aug. 23, 2005

(54) AUTOMATIC GAIN CONTROL APPARATUS

(75) Inventors: Takaaki Konishi, Ibaraki (JP); Hiroshi Azakami, Ibaraki (JP); Kazuya Ueda, Hirakata (JP); Naoya Tokunaga, Moriguchi (JP); Hisaya Kato, Soraku-gun (JP); Hiroaki Ozeki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 711 days.

(21) Appl. No.: 09/886,377

(22) Filed: Jun. 22, 2001

(65) Prior Publication Data

US 2001/0055956 A1 Dec. 27, 2001

(30) Foreign Application Priority Data

Jun. 26, 2000 (JP) .......................................... 2000-190904

(51) Int. Cl.[7] .............................................. H04B 1/06
(52) U.S. Cl. .................. 455/245.1; 455/230; 455/245.2
(58) Field of Search ........................ 455/230, 234.1, 455/239.1, 245.1, 245.2

(56) References Cited

U.S. PATENT DOCUMENTS

| | | | | |
|---|---|---|---|---|
| 4,827,511 A | * | 5/1989 | Masuko | 380/221 |
| 5,450,035 A | * | 9/1995 | Kinoshita | 330/129 |
| 5,903,854 A | * | 5/1999 | Abe et al. | 455/575.1 |
| 5,918,166 A | * | 6/1999 | Tsumura | 455/249.1 |
| 6,035,008 A | * | 3/2000 | Kim | 375/345 |
| 6,771,719 B1 | * | 8/2004 | Koyama et al. | 375/345 |

FOREIGN PATENT DOCUMENTS

| | | |
|---|---|---|
| EP | 0 797 299 | 9/1997 |
| EP | 1 089 429 | 4/2001 |
| GB | 2 348 328 | 9/2000 |
| JP | 8-097651 | 4/1996 |
| JP | 9-046614 | 2/1997 |
| JP | 2699698 | 9/1997 |
| JP | 9-294080 | 11/1997 |
| JP | 2778260 | 5/1998 |
| JP | 2000-209118 | 7/2000 |
| WO | 00/08751 | 2/2000 |

* cited by examiner

Primary Examiner—Bing Q. Bui
(74) Attorney, Agent, or Firm—Wenderoth, Lind & Ponack, L.L.P.

(57) ABSTRACT

In an automatic gain control amplifier, an RF automatic gain controller controls the gain of a radio frequency signal. A frequency converter frequency-converts the radio frequency signal into an intermediate frequency signal. An IF automatic gain controller controls the gain of the intermediate frequency. A level detector detects a signal level of the gain-controlled intermediate frequency signal, and generates a level signal. An automatic gain control signal generator separately controls, based the level signal, the RF automatic gain controller and the IF automatic gain controller.

5 Claims, 20 Drawing Sheets

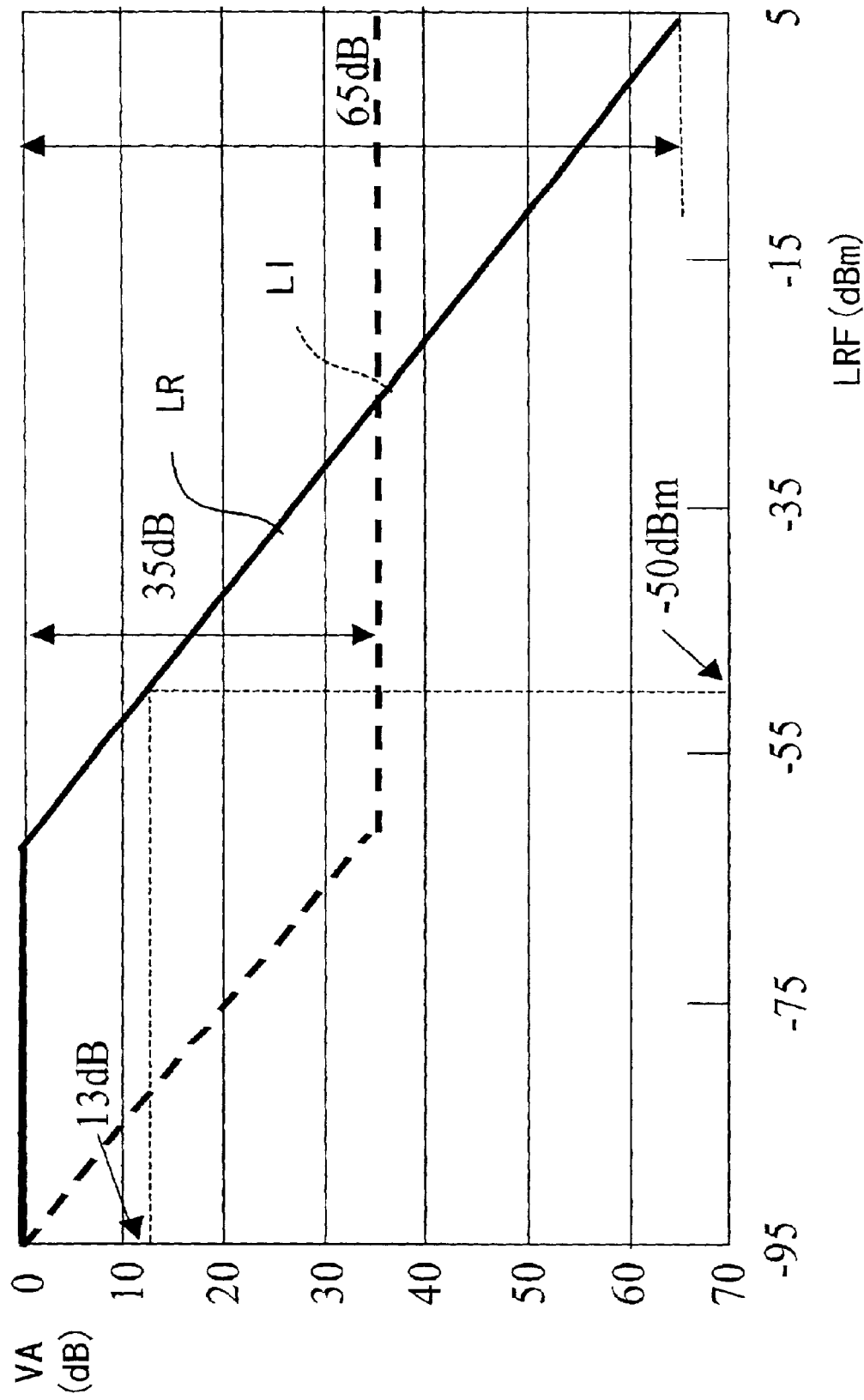

AUTOMATIC GAIN CONTROL APPARATUS

BACKGROUND OF THE INVENTION

1. Field of the Invention

The present invention relates to apparatuses for receiving television and radio broadcasting, especially digital broadcasting.

2. Description of the Background Art

Shown in FIG. 14 is the structure of an automatic gain control apparatus (hereinafter referred to as AGC apparatus) conventionally used for a digital broadcast receiving apparatus. The AGC apparatus AGC includes a tuner 30, an A/D converter 6, a level detector LD, and an automatic gain control signal generator (hereinafter, AGC signal generator) SG. The tuner 30 includes an RF automatic gain controller 2 for controlling the gain of a digital broadcast wave RF, a mixer 3, an oscillator 4, an IF automatic gain controller 5 for controlling the gain of an intermediate frequency signal Sif, and an RF gain control point setter 40.

In the tuner 30, the RF automatic gain controller 2 carries out automatic gain control and amplification of the digital broadcast wave RF for generating a digital broadcast wave Srf. This amplification is carried out based on an RF automatic gain control signal (hereinafter, RF AGC signal) SAGr supplied by the RF gain control point setter 40. The mixer 3 frequency-converts the digital broadcast wave Srf for generating the intermediate frequency signal Sif. This frequency conversion is carried out based on a reference frequency signal SB supplied by the oscillator 4. The IF automatic gain controller 5 carries out automatic gain control and amplification of the intermediate frequency signal (hereinafter, IF signal) Sif for generating a modulated analog signal SMA. In short, the tuner 30 generates the modulated analog signal SMA by frequency-converting and amplifying the digital broadcast wave RF received via an antenna.

The A/D converter 6 converts the modulated analog signal SMA from analog to digital for generating a modulated digital signal SMD. The modulated digital signal SMD is outputted to the following demodulation processing and also to the level detector LD.

The level detector LD detects the average level of the modulated digital signal SMD, and generates a level signal SL. The level signal SL indicates the level of the output from the IF automatic gain controller 5, that is, the level of the modulated analog signal SMA.

The AGC signal generator SG generates an automatic gain control signal (hereinafter, AGC signal) SAG based on the level signal SL. The AGC signal SAG is a control signal for controlling the gain of the RF automatic gain controller 2 and the IF automatic gain controller 5.

The RF gain control point setter 40 generates, based on the AGC signal SAG, an IF automatic gain control signal (hereinafter, IF AGC signal) SAGi for controlling the IF automatic gain controller 5 and an RF automatic gain control signal (hereinafter, RF AGC signal) SAGr for controlling the RF automatic gain controller 2.

Shown in FIG. 15 is the structure of the level detector LD in detail. The level detector LD includes a subtractor 12, an adder 13, a delay unit 14, and a bit shifter 15 (represented as "$2^{-n}$" in FIG. 15). Note that n represents the number of shift bits. The adder 13 and the delay unit 14 form an integrator 100. For example, if an average value is obtained from $128=2^7$ values of data, n is set to 7. If obtained from $2048=2^{12}$ data values, n is set to 12.

The digital modulated signal SMD coming from the A/D converter 6 goes to the subtractor 12, where an averaged signal $Y/2^n$ received from the bit shifter 15 is subtracted from the modulated digital signal SMD. Then, the subtraction result is outputted to the integrator 100.

Shown in FIG. 16 is the structure of the AGC signal generator SG in detail. The AGC signal generator SG includes a subtractor 16, a reference value provider 17, a multiplier 18, a constant provider 19, an integrator 22, a level converter LC, a PWM (Pulse Width Modulator) 42, and a low-pass filter 43. The integrator 22 includes an adder 20 and a delay unit 21. The level converter LC includes a multiplier 23, an inverse coefficient provider 24, an adder 38, and a compensation coefficient provider 39.

The subtractor 16 finds an error between the level signal SL supplied by the level detector LD and a predetermined reference value R supplied by the reference value provider 16, and generates an error signal SE. Note that, for the purpose of simplifying the description, signals and parameters may hereinafter be simply represented by reference characters as required. The multiplier 18 multiplies the error signal SE received from the subtractor 16 by a constant G received from the constant provider 19 to generate G·SE for output to the integrator 22.

In the integrator 22, the delay unit 21 first delays G·SE outputted from the multiplier 18 by a control cycle t, and then the adder 19 adds the delayed signal to a current output from the multiplier 18 for integration of G·SE. The integration result is outputted as an integrated signal Z from the delay unit 21 to the adder 20 and the level converter LC. Note herein that one control cycle is a sequence of control processing successively carried out in the conventional automatic gain controller or the automatic gain controller according to the present invention, and their components. Also note that one control cycle period is a time period required for execution of one control cycle, that is, a period from start of one control cycle until before start of the next control cycle.

In the level converter LC, the multiplier 23 multiplies the integrated signal Z outputted from the integrator 22 by "−1" outputted from the inverse coefficient provider 24 to invert the polarity of the integrated signal Z, and generates −Z. The adder 38 adds a compensation coefficient OB provided by the compensation coefficient provider 39 to −Z provided by the multiplier 23, and generates −Z+OB. The PWM 42 modulates the pulse width of −Z+OB received from the adder 38 to generate a square-wave signal Sr. The low-pass filter 43 extracts low-frequency components from the square-wave signal Sr supplied by the PWM 22 to generate the AGC signal SAG having a predetermined control voltage. Consequently, the gain of a loop formed by the tuner 30, the level detector LD, and the AGC signal generator SG is adjusted.

The level converter LC is briefly described below. The level converter LC is provided to normalize the value of the integrated signal Z outputted from the integrator 22 before processed by the PWM 42 for correct gain control. Therefore, the inverse coefficient provider 24 provides the inverse coefficient, that is, a predetermined negative value, to the multiplier 23 for inverting the polarity of the integrated signal Z. The compensation coefficient provider 39 provides, for the sake of convenience of the processing in the PWM 42, the compensation coefficient OB having a predetermined value for compensating the inverted integrated signal Z (−Z) so that it takes a positive value or 0.

The value of the compensation coefficient OB is determined based on the inverse coefficient provided by the inverse coefficient provider 24 and the number of output bits of the integrator 22. Now, consider the case where the inverse coefficient is −1, and the number of output bits of the integrator 22 is 12. In this case, the integrated signal Z takes a value in the range of −2048 to +2047. If the compensation coefficient OB is set to 12 bits (OB=2048), which is the number of output bits of the integrator 22, the value of −Z+OB outputted from the adder 38 falls within the range of 0 to +4095.

If the error signal SE indicates 0, the value of −Z+OB outputted from the adder 38 falls within the range of +2048 (OB). If the error signal SE has a negative value, −Z+OB falls within the range of 0 to +2047. As such, correct gain control can be achieved according to the average level of the digital broadcast wave Srf.

In other words, when a predetermined time has passed and the outputs from the integrator 22 become converged, the signal indicating any one of the following three values is supplied to the PWM 42, where the number of output bits of the integrator 22 is 12.

Firstly, the output from the integrator 22 has a positive value if the average level of the digital broadcast wave RF is higher than the reference value R set in the reference value provider 17. Therefore, the PWM 42 receives a value of less than 2048.

Secondly, the PWM 42 receives a value of 2048 if the average level of the digital broadcast wave RF is equal to the reference value R.

Thirdly, the PWM 42 receives a value of equal to or larger than 2049 if the average level of the digital broadcast wave RF is lower than the reference value R.

Shown in FIG. 17 are waveforms of the square-wave signal Sr. In the PWM 42, the pulse width of the square-wave signal Sr is changed according to the received −Z+OB. For example, if −Z+OB is 4095, the square-wave signal Sr constant at 1 is outputted, as represented by a waveform W1. If −Z+OB is 2048, the square-wave signal Sr alternately indicating 0 and 1 is outputted, as shown in FIG. 17, as represented by a waveform W2. If −Z+OB is 0, the square-wave signal Sr constant at 0 is outputted, as represented by a waveform W3.

Then, the square-wave signal Sr is converted by the low-pass filter 43 into the AGC signal SAG having a DC voltage. Then, the AGC signal SAG is outputted to the RF gain control point setter 40.

The RF gain control point setter 40 generates the RF AGC signal SAGr for attenuating the gain of the RF automatic gain controller 2 when the value of the AGC signal SAG becomes lower than a predetermined value. The RF gain control point setter 40 also generates the IF AGC signal SAGi for always varying the gain of the IF automatic gain controller 5.

FIGS. 15 and 16 schematically illustrate processes on various signals generated in the level detector LD and the AGC signal generator SG in an arbitrary control cycle t. Throughout this specification, the control cycle is represented as t. That is, a control cycle previous to the control cycle t is represented as t with a natural number added thereto, and the one next thereto as t with a natural number subtracted therefrom. As such, the control cycle t is also a parameter indicating a relative time. Furthermore, for the sake of convenience, the control cycle t may be simply referred to as "t", and also each signal and parameter may be referred to as its reference character.

As shown in FIG. 15, the subtractor 12 of the level detector LD subtracts the averaged signal $Y(t+1)/2^n$ supplied by the bit shifter 15 from SMD(t) supplied by the A/D converter 6 to generate $SMD(t)-Y(t+1)/2^n$.

The adder 13 of the integrator 100 adds $SMD(t)-Y(t+1)/2^n$ supplied by the subtractor 12 to the integrated signal $Y(t+1)$ supplied by the delay unit 14 to generate $SMD(t)-Y(t+1)/2^n+Y(t+1)=SMD(t)+Y(t+1)(1-2^{-n})$.

The delay unit 14 delays $SMD(t)+Y(t+1)(1-2^{-n})$ outputted from the adder 13 by one control cycle t to generate an integrated signal $Y(t+1)$.

The bit shifter 15 shifts the integrated signal $Y(t+1)$ by the predetermined number of shift bits n to generate an averaged signal $Y(t+1)/2^n$. This averaged signal $Y(t+1)/2^n$ is equivalent to the average of $2^n$ data values of the modulated digital signal SMD supplied to the level detector LD. In this sense, the number of shift bits n defines the number of data values required for finding the average value by the bit shifter 15. In other words, $2^n$ is the number of data values required for finding the average value of the modulated digital signal SMD supplied to the level detector LD, and the number of shift bits n is an averaging coefficient. Hereinafter, $2^n$ is referred to as the number of data values for averaging.

Next, as shown in FIG. 16, the subtractor 16 of the AGC signal generator SG subtracts the reference value R provided by the reference value provider 17 from the level signal SL supplied by the level detector LD to generate the error signal SE(t).

The multiplier 18 multiplies SE (t) supplied by the subtractor 16 by the constant G provided by the constant provider 19 to generate G·SE(t).

The adder 20 of the integrator 22 adds G·SE(t) supplied by the multiplier 18 to the integrated signal Z(t+1) outputted from the delay unit 21 to generate G·SE (t)+Z (t+1).

The delay unit 21 delays G·SE(t)+Z(t+1) supplied by the adder 20 by one control cycle t to generate the integrated signal Z(t+1).

The multiplier 23 of the level converter LC multiplies the integrated signal Z(t+1) received from the delay unit 21 by the inverse coefficient "−1" received from the inverse coefficient provider 24 to generate −Z(t+1).

The adder 38 adds −Z(t+1) supplied by the multiplier 23 to the compensation coefficient OB provided by the compensation coefficient provider 39 to generate −Z(t+1)+OB.

The PWM 42 modulates the pulse width of −Z(t+1)+OB supplied by the level converter LC to generate a square-wave signal Sr. The low-pass filter 23 extracts low-frequency components from the square-wave signal Sr supplied by the PWM 42 to generate the AGC signal SAG at a desired stable level.

Shown in FIG. 18 are changes in the gain of the RF automatic gain controller 2 and the IF automatic gain controller 5 with respect to the digital broadcast wave RF. In FIG. 18, the vertical axis VA represents attenuation (dB) from the maximum gain, and the lateral axis LRF represents the level of the digital broadcast wave RF. A solid line LR represents gain attenuation of the RF automatic gain controller 2, while a dotted line LI represents that of the IF automatic gain controller 5.

As is evident from FIG. 18, when the attenuation is 0, the maximum gain is observed for both of the RF and IF automatic gain controllers 2 and 5. Between −78 dBm and −5 dBm, the gain is attenuated mainly by the RF automatic gain controller 2, but also slightly by the IF automatic gain controller 5. This is because the ratio of the RF AGC signal to attenuation achieved by the RF automatic gain controller 2 is larger than the ratio of IF AGC signal to attenuation achieved by the IF automatic gain controller 5.

When the level of the digital broadcast wave RF is in the ranges of 0 dBM to −178 dBm and over −5 dBm, the gain is attenuated only by the IF automatic gain controller 5.

Under −78 dBm, the RF automatic gain controller 2 generates the RF AGC signal SAGr to prevent attenuation in itself. Over −5 dBm, the RF automatic gain controller 2 can hardly attenuate the gain, and the IF automatic gain controller 5 automatically controls the gain.

The reason of such control is that the gain of the RF and IF automatic gain controllers 2 and 5 has to be appropriately adjusted according to the level of the digital broadcast wave RF. More specifically, in a low electric field intensity where the digital broadcast wave RF is under −78 dBm, degradation of the C/N (Carrier to Noise) ratio at the tuner 30 has to be prevented. In that case, control is carried out so that the noise factor at the tuner 30 becomes lower, that is, the gain of the RF automatic gain controller 2 becomes maximum.

As the level of the digital broadcast wave RF becomes higher, the capabilities at the mixer 3 of suppressing intermodulation-distortion interference and adjacent-channel interference have to be increased. Therefore, over −78 dBm, the gain of the RF automatic gain controller 2 is mainly attenuated so that the level of the signal supplied to the mixer 3 does not become increased. Then, over −5 dBm where the RF automatic gain controller 2 can no longer control the gain, the IF automatic gain controller 5 is started in operation.

Shown in FIG. 19 are changes in the gain of the RF automatic gain controller 2 and the IF automatic gain controller 5 with respect to the level of the digital broadcast wave RF in an AGC apparatuses disclosed in Japanese Patent Gazettes Nos. 2699698 and 2778260. Also in FIG. 19, the vertical axis VA represents attenuation (dB) from the maximum gain, and the lateral axis LRF represents the level of the digital broadcast wave RF. A solid line LR represents gain attenuation of the RF automatic gain controller 2, while a dotted line LI represents that of the IF automatic gain controller 5.

In these automatic gain controllers for increasing the capabilities of suppressing intermodulation-distortion interference and adjacent-channel when the level of the digital broadcast wave RF is −78 dBm, the gain of the RF automatic gain controller (corresponding to a low-noise amplifier in the above Gazette No. 2699698 and a first gain control circuit in the above Gazette No. 2778260) is maximized, while the gain of the IF automatic gain controller is attenuated. Over −78 dBm, the gain of the IF automatic gain controller is made constant, while the gain of the RF automatic gain controller is attenuated. Consequently, the maximum attenuation is 65 dB for the RF automatic gain controller, and 17 dB for the IF automatic gain controller. Therefore, the amount of change in gain, that is, a dynamic range, of the receiver is 82 dB.

However, the receive level of the digital broadcast wave for ground-wave digital broadcast receivers to display on television is −85 dBm to 5 dBm, and the dynamic range is 90 dB. Controlling the level of the RF input signal by both RF and IF automatic gain controllers requires some margin in dynamic range, and therefore the dynamic range has to be 100 dB in reality. Also, for ensuring the dynamic range of 100 dB, the maximum attenuation of the IF automatic gain controller may be controlled to 35 dB, as shown in FIG. 20.

In this case, however, when the level of the digital broadcast wave RF is under −60 dBm, the gain of the RF automatic gain controller is maximized, while the gain of the IF automatic gain controller is attenuated. Over −60 dBm, the former is attenuated, while the latter is made constant. Consequently, the attenuation of the RF automatic gain controller 2 at −50 dBm is 13 dB, thereby increasing the level of the signal supplied to the mixer 3. Therefore, when the level of the digital broadcast wave is at −50 dBm, for example, the capability of suppressing intermodulation-distortion interference is significantly degraded and, in turn, the capability of suppressing adjacent-channel interference is also significantly degraded.

As stated above, in the conventional AGC apparatus AGC characterized by the changes in the gain of RF and IF automatic gain controller 2 and 5 as shown in FIG. 18, when the digital broadcast wave RF is in the range of −78 dBm to 15 dBm, the gain of the RF automatic gain controller 2 is attenuated. In that range, the gain of the IF automatic gain controller 5 is also attenuated, although slightly, by approximately 7 dB (changed from 18 dB to 25 dB).

For example, the gain attenuation of the IF automatic gain controller 5 is 18 dB when the level of the digital broadcast wave RF is at −78 dBm, while 22 dB at −50 dBm. As a result, the attenuation is increased by 4 dB. Therefore, the signal supplied to the mixer 3 is increased in level by 4 dB at −50 dBm, compared with the case where the gain attenuation of the IF automatic gain controller 5 does not change at all in the range of −78 dBm to −5 dBm. Such increase disadvantageously causes degradation by 4 dB in the capability of suppressing intermodulation-distortion interference and, in turn, the capability of suppressing adjacent-channel interference.

In another example, the gain attenuation of the IF automatic gain controller 5 is 18 dB when the level of the digital broadcast wave RF is at −78 dBm, while 25 dB at −5 dBm. As a result, the attenuation is increased by 7 dB. Therefore, the signal supplied to the mixer 3 is increased in level by 7 dB at −5 dBm, compared with the case where the gain attenuation of the IF automatic gain controller 5 does not change at all in the range of −78 dBm to −5 dBm. Such increase disadvantageously causes degradation by 7 dB in capability of suppressing intermodulation-distortion interference.

Furthermore, in the above Gazettes, when ground-wave digital broadcasting is received, the stronger the capability of suppressing adjacent-channel interference is made, the narrower the dynamic range becomes. And, the wider the dynamic range is made, the weaker the capability of suppressing intermodulation-distortion interference becomes, resulting in significant degradation of the capability of suppressing the adjacent-channel interference.

SUMMARY OF THE INVENTION

Therefore, an object of the present invention is to solve the above problems by providing an AGC apparatus that can achieve a wider dynamic range without impairment of the capabilities of suppressing intermodulation-distortion interference and adjacent-channel interference.

The present invention has the following features to attain the object above.

A first aspect of the present invention is directed to an automatic gain control apparatus that comprises an RF automatic gain controller for controlling gain of a radio frequency signal; a frequency converter for frequency-converting the radio frequency signal into an intermediate frequency signal; an IF automatic gain controller for controlling gain of the intermediate frequency signal; a level detector for detecting a signal level of the intermediate frequency signal with the gain controlled, and generating a level signal; and automatic gain control signal generator for generating, based on the level signal, an RF automatic gain control signal for controlling the RF automatic gain controller and an IF automatic gain control signal for controlling the IF automatic gain controller, to separately control the RF automatic gain controller and the IF automatic gain controller.

As described above, in the first aspect, the RF and IF automatic gain controllers are separately controlled. Therefore, it is possible to improve the capabilities of suppressing adjacent-channel interference and intermodulation-distortion interference with a large dynamic range.

According to a second aspect, in the first aspect, if the level signal indicates a level equal to or lower than a first predetermined level, the automatic gain control signal generator fixes the gain of the RF automatic gain controller to a maximum value, and changes the gain of the IF automatic gain controller, if the level signal indicates a level higher than the first predetermined level and equal to or lower than a second predetermined level, the automatic gain control signal generator fixes the gain of the IF automatic gain controller to the first predetermined value, and changes the gain of said RF automatic gain controller. If said level signal indicates a level higher than said second predetermined level, said automatic gain control signal generator fixes the gain of said RF automatic gain controller to a second predetermined value, and changes the gain of the IF automatic gain controller.

As described above, in the second aspect, the same effects as in the first aspect can be achieved with the dynamic range more varied.

According to a third aspect, in the first aspect, if the level signal indicates a level equal to or lower than a third predetermined level, the automatic gain control signal generator fixes the gain of the RF automatic gain controller to a maximum value. If the level signal indicates a level higher than the third predetermined level and equal to or lower than a fourth predetermined level, the automatic gain control signal generator changes the gain of the IF automatic gain controller. If the level signal indicates a level higher than the fourth predetermined level, the automatic gain control signal generator fixes the gain of the RF automatic gain controller to a third predetermined value. If the level signal indicates a level equal to or lower than a fifth predetermined level, the automatic gain control signal generator changes the gain of the IF automatic gain controller. If the level signal indicates a level higher than the fifth predetermined level and equal to or lower than a sixth predetermined level, the automatic gain control signal generator fixes the gain of the IF automatic gain controller to a fourth predetermined value. If the level signal indicates a level higher than the sixth predetermined level, the automatic gain control signal generator changes the gain of the IF automatic gain controller.

As described above, in the third aspect, the same effects as in the second aspect can be achieved.

According to a fourth aspect, in the third aspect, the automatic gain control apparatus further comprises a microcomputer for setting the first and second predetermined levels at which the gain of the RF automatic gain controller and the gain of the IF automatic gain controller is changed or fixed, a parameter indicating a gradient of the radio frequency signal to the RF automatic gain control signal while the gain of the RF automatic gain controller is changed, and a parameter indicating a gradient of the radio frequency signal to the IF automatic gain control signal while the gain of the IF automatic gain controller is changed.

As described above, in the fourth aspect, the same effects as in the first to third aspect can be achieved with a smaller circuit in size.

According to a fifth aspect, in the third aspect, the automatic gain control apparatus further comprises a microcomputer for setting the third and fourth predetermined levels at which the gain of the RF automatic gain controller is changed or fixed according to the radio frequency signal, the fifth and sixth predetermined levels at which the gain of the IF automatic gain controller is changed or fixed according to the radio frequency signal, a parameter indicating a gradient of the radio frequency signal to the RF automatic gain control signal while the gain of the RF automatic gain controller is changed, and a parameter indicating a gradient of the radio frequency signal to the IF automatic gain control signal while the gain of the IF automatic gain controller is changed.

As described above, in the fifth aspect, in addition to the same effects as in the fourth aspect, influences of variations in quality of the tuner can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 20 is a diagram showing the attenuation characteristics as in FIG. 19, when widening the dynamic range is of primary concern.

DESCRIPTION OF THE PREFERRED EMBODIMENTS

With reference to FIGS. 1, 2, 3, 4, 5, 6, 7, 8, and 9, described below first is an automatic gain control (AGC) apparatus according to a first embodiment of the present invention. Then, with reference to FIGS. 10, 11, 12, and 13, described is an AGC apparatus according to a second embodiment of the present invention.

(First Embodiment)

With reference to FIGS. 1 through 9, described below is the AGC apparatus of the first embodiment. Prior to that, the basic concept of the present invention is first described. In the present invention, an RF automatic gain controller and an IF automatic gain controller are separately controlled. With this control, the present AGC apparatus can improve the capabilities of suppressing intermodulation-distortion interference and adjacent-channel interference with a wide dynamic range.

Figure 1:
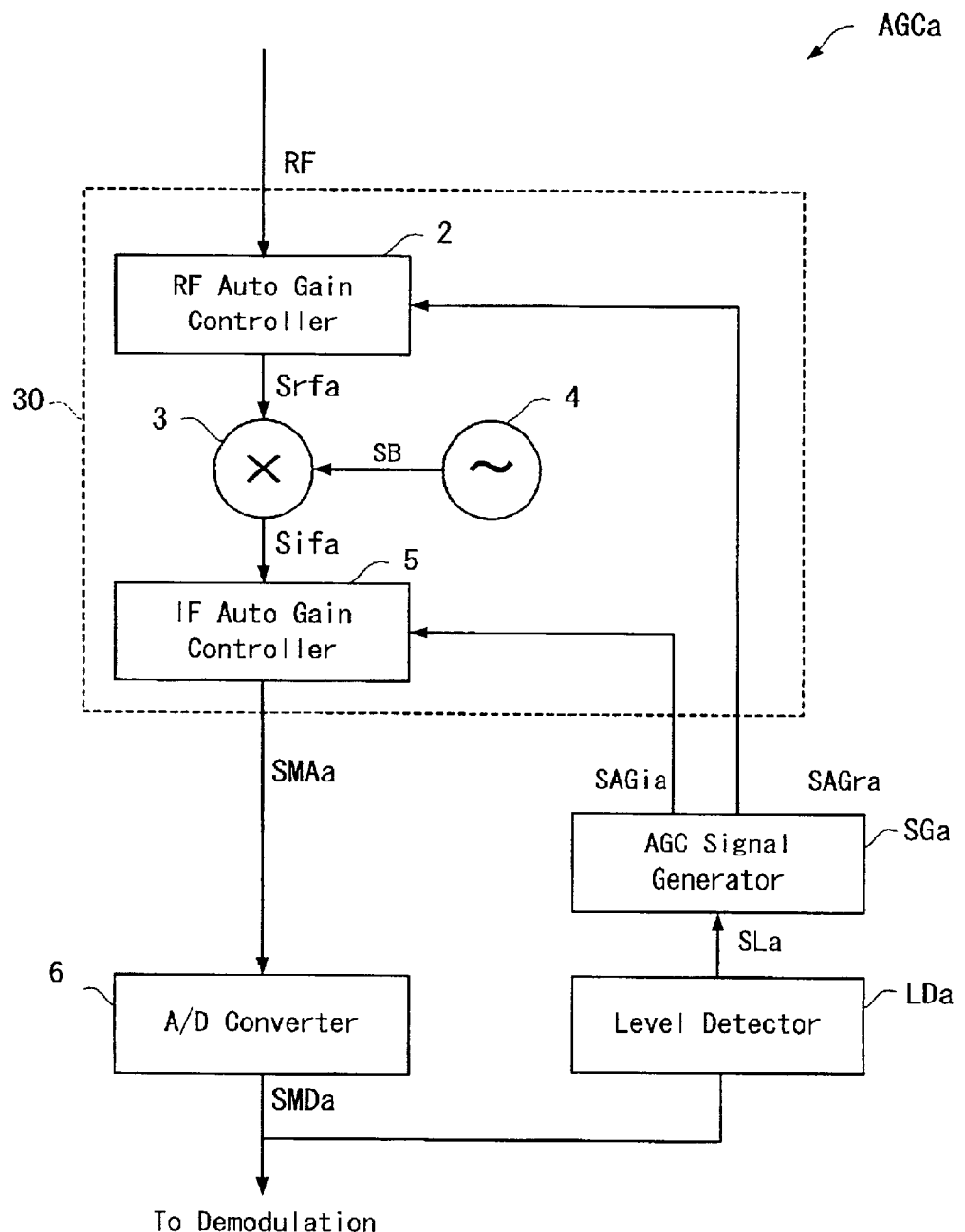
FIG. 1 is a block diagram depicting the structure of an automatic gain control (AGC) apparatus according to a first embodiment of the present invention.

As shown in FIG. 1, the AGC apparatus AGCa includes a tuner 30, an A/D converter 6, a level detector Lda, and an automatic gain control signal generator (hereinafter, AGC signal generator) SGa. The tuner 30 frequency-converts and amplifies a digital broadcast wave RF received by an antenna to generate an analog signal SMAa. The tuner 30 includes an RF automatic gain controller 2, a mixer 3, an oscillator 4, and an IF automatic gain controller 5.

In the tuner 30, the RF automatic gain controller 2 carries out automatic gain control and amplification on the digital broadcast wave RF to generate a digital broadcast wave Srfa. This is done based on an RF automatic gain control signal (hereinafter, RF AGC signal) SAGra supplied by the AGC signal generator SGa. The mixer 3 frequency-converts the digital broadcast wave Srfa to an intermediate frequency signal Sifa. This is done based on a reference frequency signal SB supplied by the oscillator 4. The IF automatic gain controller 5 carries out automatic gain control and amplification on the intermediate frequency signal Sifa to generate a modulated analog signal SMAa. This is done based on an IF automatic gain control signal (hereinafter, IF AGC signal) SAGia supplied by the RF gain control point setter 40.

The A/D converter 6 converts the modulated analog signal SMAa from analog to digital to generate a modulated digital signal SMDa. The modulated digital signal SMDa is outputted to the following demodulation processing and also to the level detector LDa.

The level detector LDa detects the average level of the modulated digital signal SMDa, and generates a level signal SLa. This level signal indicates the level of the output from the IF automatic gain controller 5, that is, the average level of the modulated analog signal SMA.

The AGC signal generator SGa generates, based on the level signal SLa, the IF AGC signal SAGia and the RF AGC signal SAGra.

Figure 2:
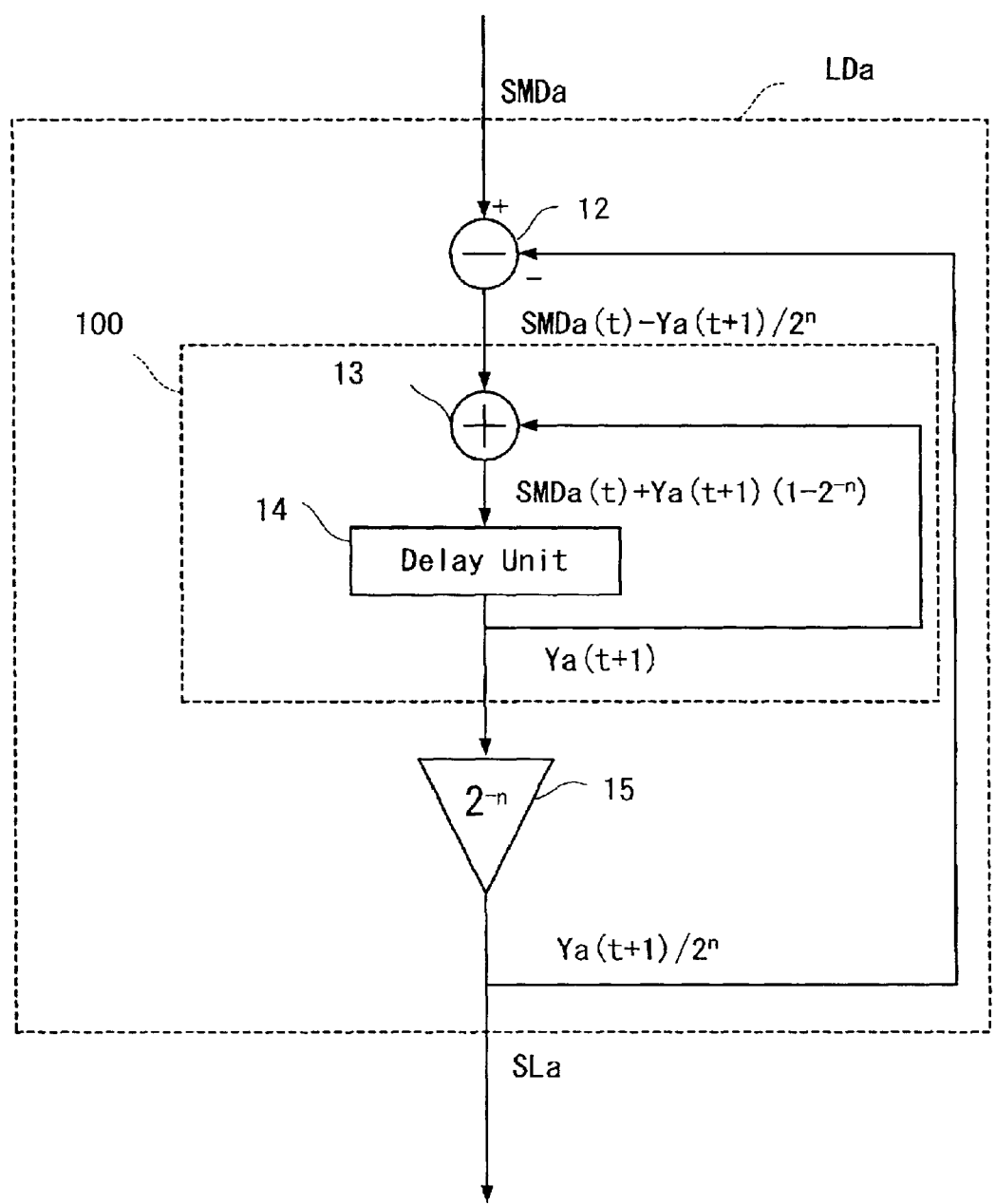
FIG. 2 is a block diagram depicting the structure of a first level detector shown in FIG. 1.
Figure 15:
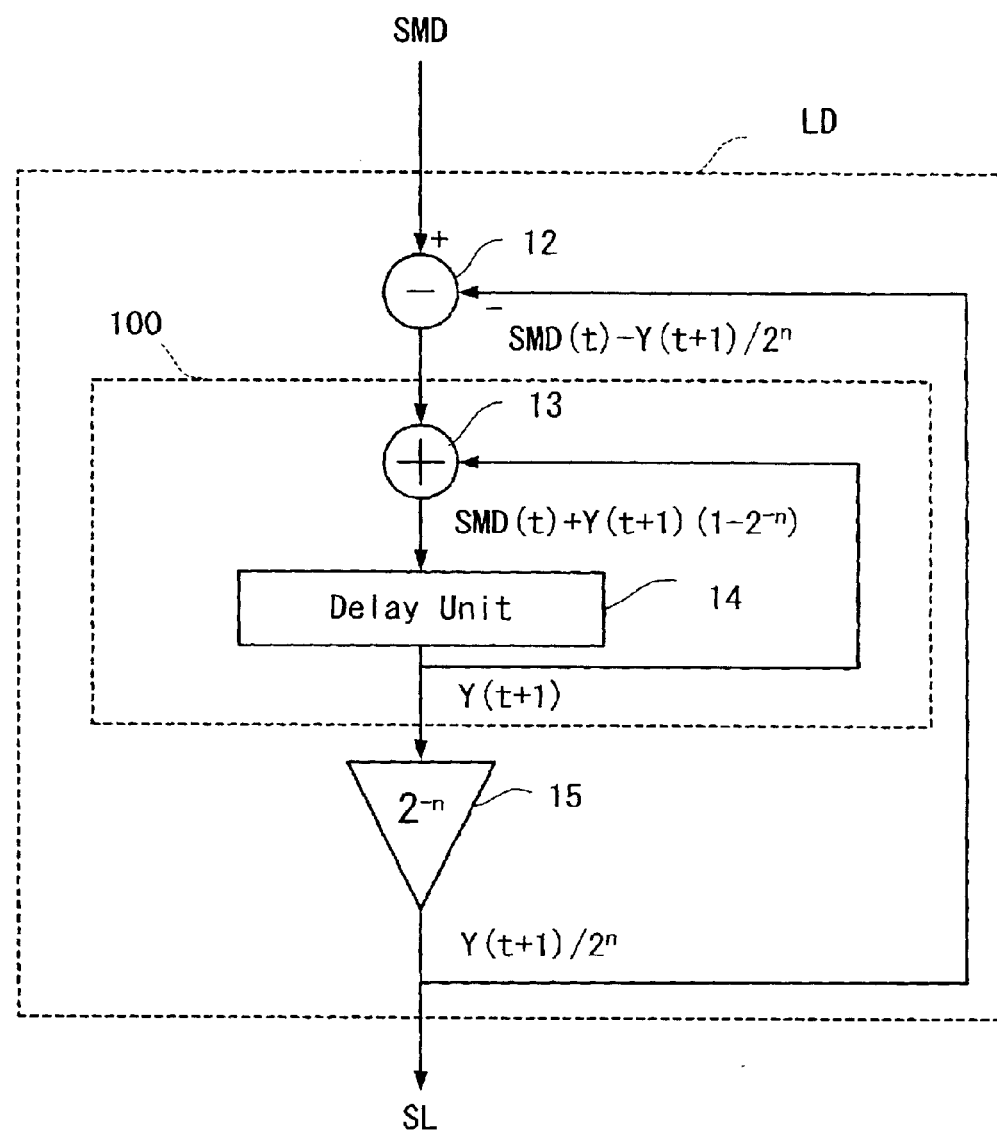
FIG. 15 is a block diagram showing the structure of a level detector shown in FIG. 14.
Figure 16:
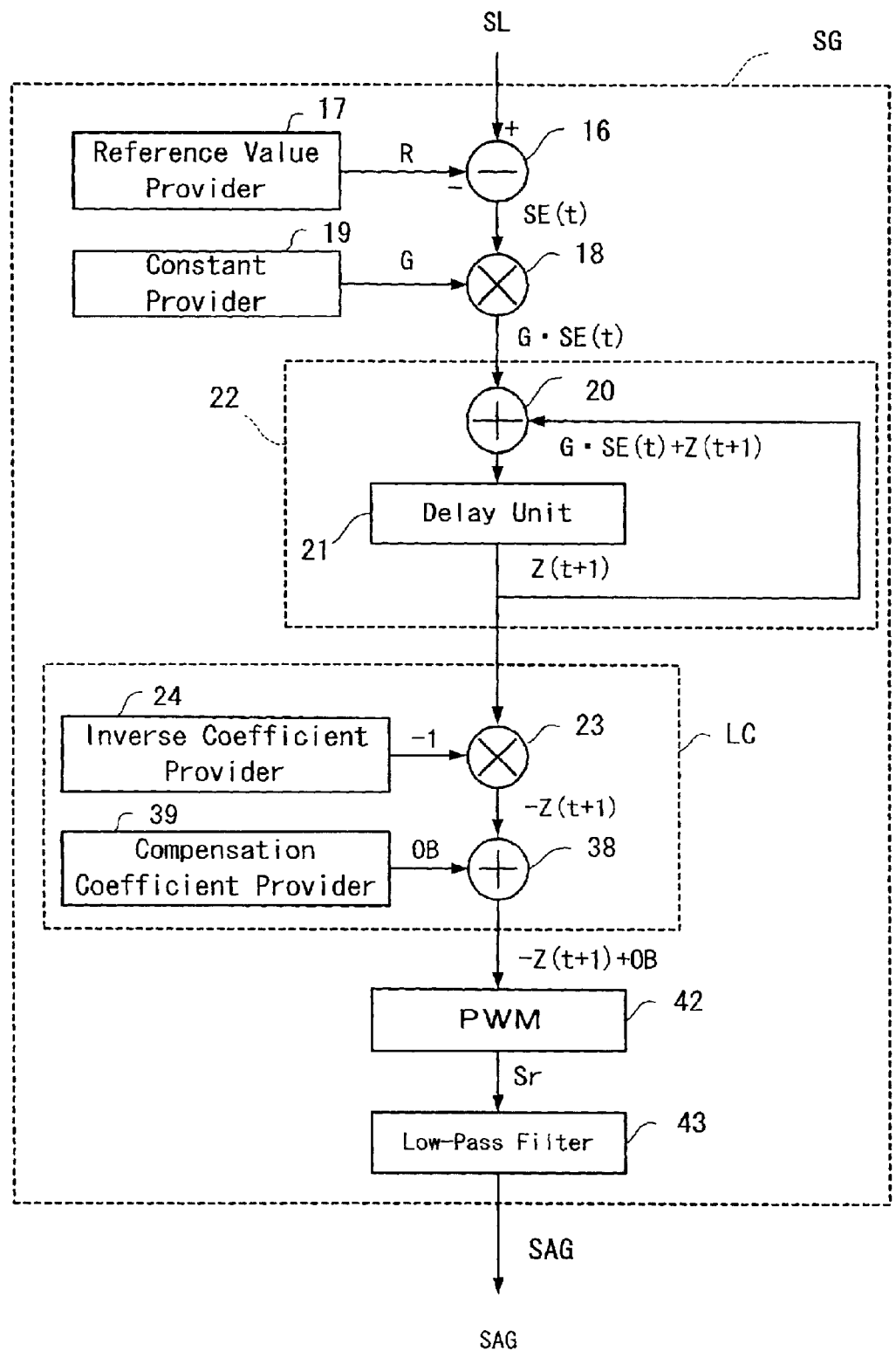
FIG. 16 is a block diagram showing an AGC signal generator shown in FIG. 14.
Figure 17:
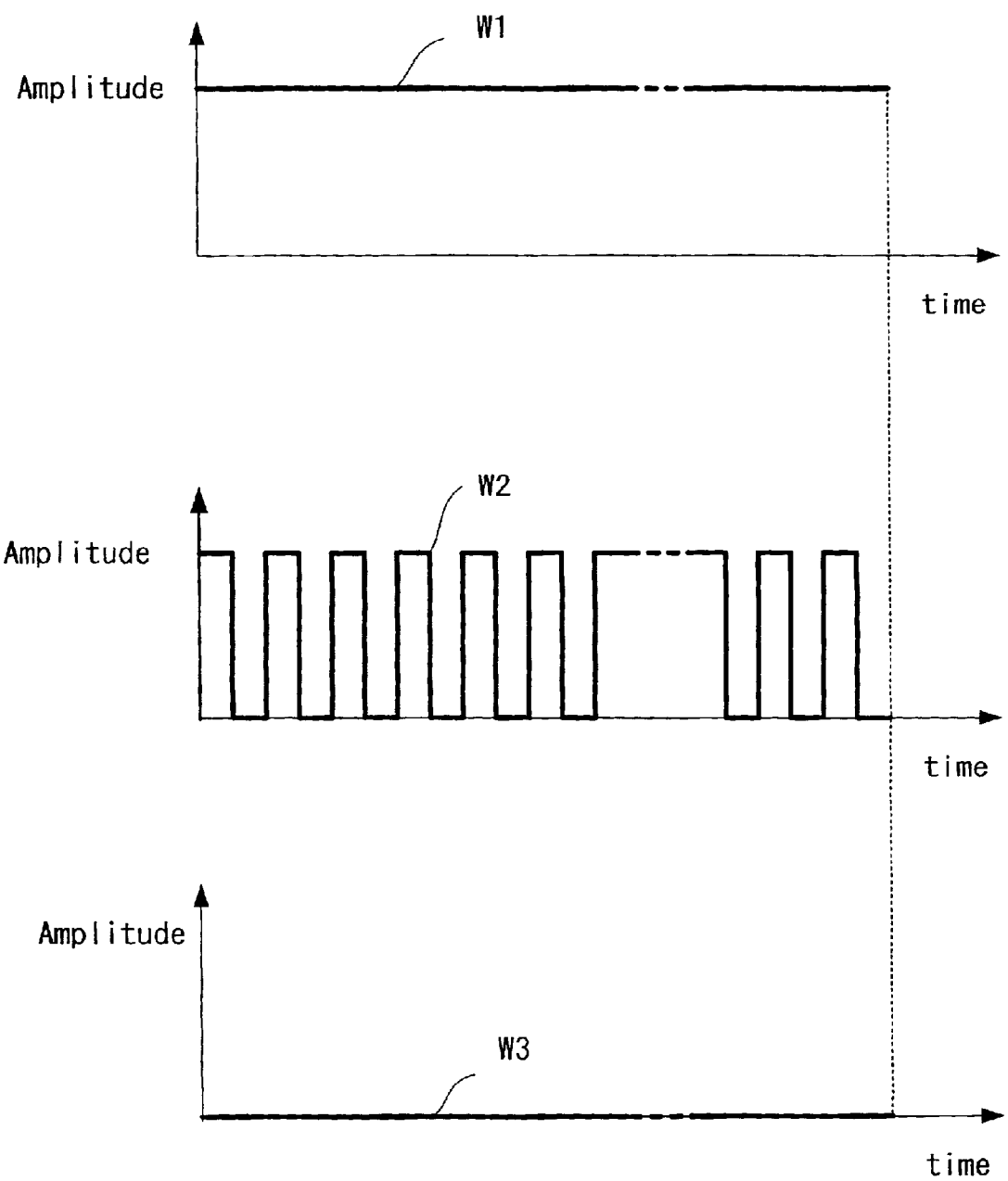
FIG. 17 is a block diagram showing PWM output waveforms in the AGC apparatus shown in FIG. 14.

Shown in FIG. 2 is the level detector LDa in detail. As with the conventional level detector LD structuring the AGC apparatus AGC already described by referring to FIG. 15, the level detector LDa includes a subtractor 12, an adder 14, a delay unit 14, and a bit shifter 15. Here, the number of shift bit n for the level detector LDa is equal to that for the level detector LD (in this example, n=12).

Figure 3:
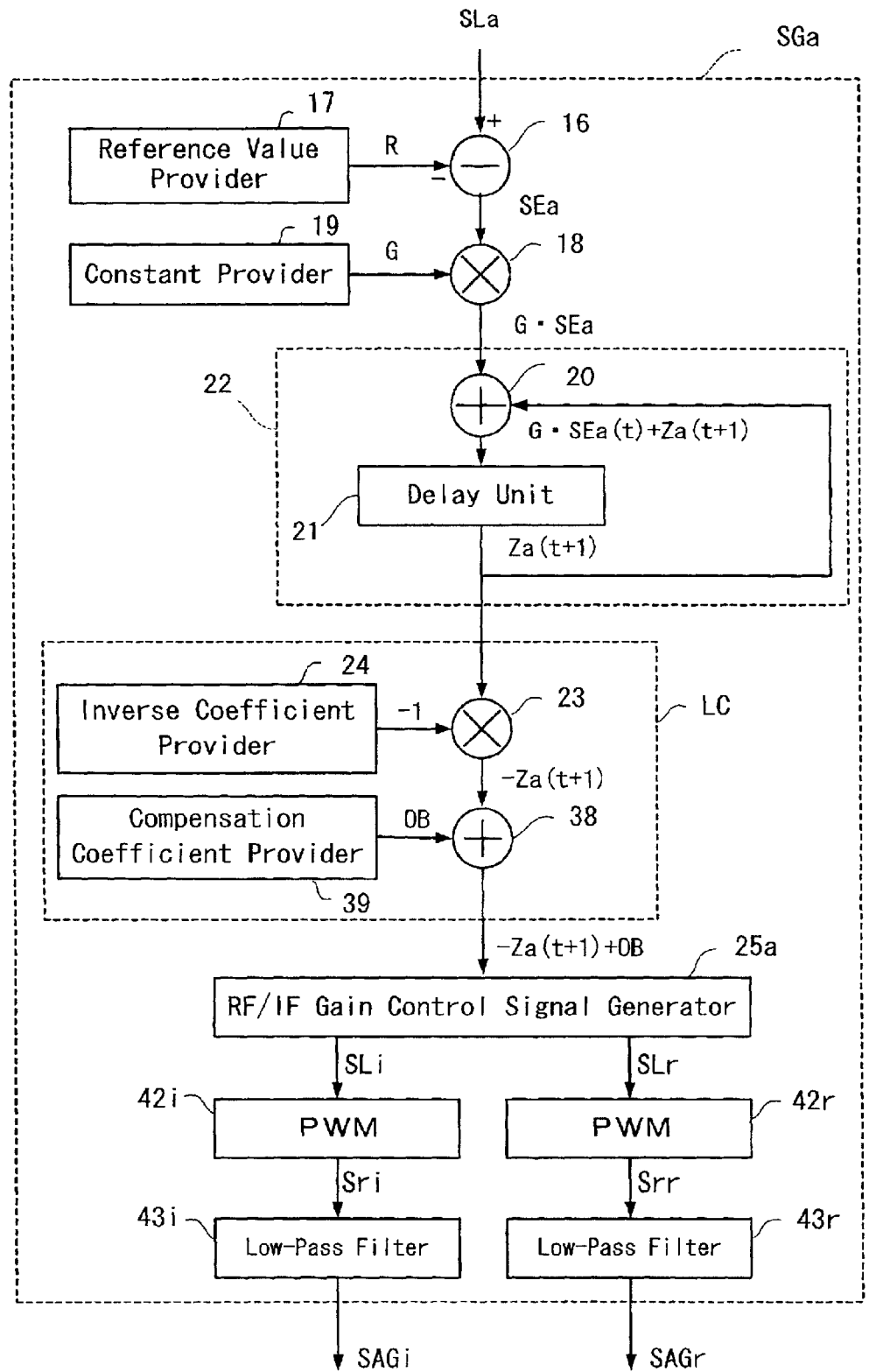
FIG. 3 is a block diagram depicting the structure of a automatic gain control (AGC) signal generator shown in FIG. 1.

With reference to FIG. 3, the AGC signal generator SGa is described. The AGC signal generator SGa includes a subtractor 16, a reference value provider 17, a multiplier 18, a constant provider 19, an integrator 22, a level converter LC, an RF/IF gain control signal generator 25a, a PWM 42i, a PWM 42r, an LPF (low-pass filter) 43i, and an LPF (low-pass filter) 43r. The reference value provider 17 outputs a reference value R for controlling the digital broadcast wave SMAa outputted from the tuner 30 to have a desired value. The constant provider 19 provides a constant G for determining the gain of a loop formed by the tuner 30, the level detector LDa, and the AGC signal generator SGa. The integrator 22 includes an adder 20 and a delay unit 21. The level converter LC includes a multiplier 23, an inverse coefficient provider 24, an adder 38, and a compensation coefficient provider 39.

The subtractor 16 finds an error between the level signal SLa provided by the level detector LDa and the reference value R provided by the reference value provider 17, and generates an error signal SEa. The multiplier 18 multiplies the error signal SEa found in the subtractor 16 by the constant G received from the constant provider 19, and outputs the multiplication result G·SEa to the integrator 22.

In the integrator 22, the delay unit 21 delays G·SEa received from the multiplier 18 by one control cycle t, and then the adder 19 adds it to the current output. As such, the integrator 21 integrates G·SEa. The integration result is outputted as an integrated signal Za to the adder 20 and the level converter LC.

In the level converter LC, the multiplier 23 multiplies the integrated signal Za by an inverse coefficient "−1" received from the inverse coefficient provider 24, thereby inverting the polarity of the integrated signal Za to generate −Za. The adder 38 adds the compensation coefficient OB supplied by the compensation coefficient provider 39 to −Za supplied by the multiplier 23 to generate −Za+OB.

The RF/IF gain control signal generator 25a generates, based on −Za+OB received from the adder 38, an IF level signal SLi and an RF level signal SLr. The PWM 42i modulates the pulse width of the IF level signal SLi supplied by the RF/IF gain control signal generator 25a, and generates a square-wave signal Sri. The LPF 43i extracts low-frequency components from the square-wave signal Sri supplied by the PWM 42i, and generates the IF AGC signal SAGi having a predetermined voltage. The PWM 42r modulates the pulse width of the RF level signal SLr supplied by the RF/IF gain control signal generator 25a, and generates a square-wave signal Srr. The LPF 43r extracts low-frequency components from the square-wave signal Srr supplied by the PWM 42r, and generates the RF AGC signal SAGr having a predetermined voltage.

The level converter LC is briefly described below. The level converter LC is provided to normalize the value of the integrated signal Za outputted from the integrator 22 before processed by the RF/IF gain control signal generator 25 for correct gain control even if the value of integrated signal Za is larger than the reference value. Therefore, the inverse coefficient provider 24 provides the inverse coefficient, that is, a predetermined negative value, to the multiplier 23 for inverting the polarity of the integrated signal Za. The compensation coefficient provider 39 provides, for the sake of convenience of the RF/IF gain control signal generator 25, the compensation coefficient OB having a predetermined value for compensating the inverted integrated signal Za (−Za) so that it takes a positive value or 0.

The value of the compensation coefficient OB is determined based on the inverse coefficient provided by the inverse coefficient provider 24 and the number of output bits of the integrator 22. Now, consider the case where the inverse coefficient is −1, and the number of output bits of the integrator 22 is 12. In this case, the integrated signal Za takes a value in the range of −2048 to +2047. If the compensation coefficient OB is set to 12 bits (OB=2048), which is the number of output bits of the integrator 22, the value of −Za+OB outputted from the adder 38 falls within the range of 0 to +4095.

If the output Za from the integrator 22 indicates 0, the value of −Za+OB outputted from the adder 38 falls within the range of +2048 (OB). If the error signal SE has a negative value, −Za+OB falls within the range of 0 to +2047. If the output Za is indicates a positive value, −Za+OB falls within the range of +2049 to +4095. As such, correct gain control can be achieved according to the average level of the digital broadcast wave RF.

In other words, when a predetermined time has passed and the outputs from the integrator 22 become converged, the signal indicating any one of the following three values is supplied to the RF/IF gain control signal generator 25 according to the average level of the digital broadcast wave RF, where the number of output bits of the integrator 22 is 12.

Firstly, the output from the integrator 22 has a positive value if the average level of the digital broadcast wave RF is higher than the reference value R set in the reference value provider 17. Therefore, the RF/IF gain control signal generator 25a receives a value of less than 2048.

Secondly, the RF/IF gain control signal generator 25a receives a value of 2048 if the average level of the digital broadcast wave RF is equal to the reference value R.

Thirdly, the RF/IF gain control signal generator 25a receives a value of equal to or larger than 2049 if the average level of the digital broadcast wave RF is lower than the reference value R.

Figure 4:
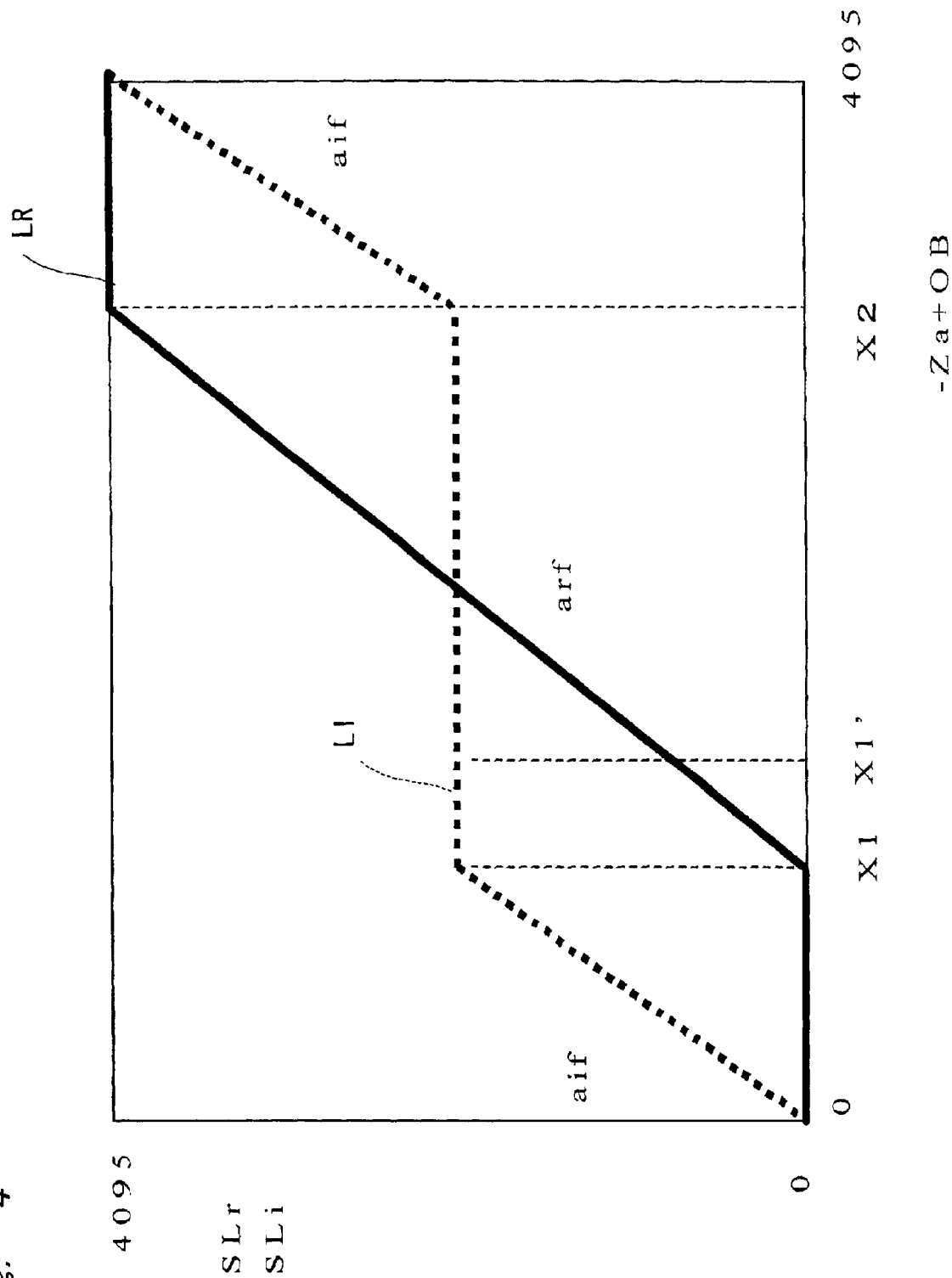
FIG. 4 is a diagram showing an input-to-output characteristic of an RF/IF gain control signal generator shown in FIG. 1.

Shown in FIG. 4 is a relation between the RF level signal SLr and the IF level signal SLi with respect to the signal (−Za+OB) supplied to the RF/IF gain control signal generator 25a. The vertical axis represents the level of the RF level signal SLr and the IF level signal SLi, while the lateral axis represents the value of integrated signal Za+OB supplied to the RF/IF gain control signal generator 25a. A solid line LR represents the RF level signal SLr, while a dotted line LI represents the IF level signal SLi. X1 and X2 on the lateral axis indicate values of Za+OB when the characteristic of the RF and IF level signal SLr change.

In FIG. 4, the IF level signal SLi increases at a predetermined rate while the value of Za+OB increases from 0 to X1. That is, the dotted line LI extends having a predetermined gradient aif. Between X1 and X2, the level signal SLi has a constant value. Then, from X2 to 4095, the level signal SLi again increases having the predetermined gradient aif.

On the other hand, the RF level signal SLr is constant at 0 and does not change while the value of Za+OB increases from 0 to X1. That is, the solid line LR extends having a gradient of 0. Between X1 and X2, the level signal SLr increases at a predetermined rate, and then reaches 4095 at X2. Then, from X2 to 4095, the level signal SLr is constant at 4095 without change.

The characteristic of the RF level signal SLr typified by the solid line LR is represented by the following equations (1), (2), (3), (4), and (5), while the characteristic of the IF level signal SLi typified by the dotted line LI is represented by the following equations (6), (7), (8), (9), and (10). Note that, in the following equations, y corresponds to the vertical axis in FIG. 4, that is, the RF and IF level signals SLr and SLi. And, x corresponds to the lateral axis in FIG. 4, that is, the value of integrated signal Za+OB supplied to the RF/IF gain control signal generator 25a. In the following description as to FIG. 4, the value of the signal −Za+OB supplied to the RF/IF gain control signal generator 25a is simply referred to as "value x", and the values of the RF and IF level signals SLr and SLi are simply referred to as "value y", for convenience. Also note that "brf" in the following equations (2) and (12) and "bif" in the following equations (8) and (18) are constants.

$$y=0(X1 \geq x) \quad (1)$$

$$y=arf \cdot x+brf \quad (2)$$

$$y=4095(x>X2) \quad (3)$$

$$arf=4095/(X2-X1) \quad (4)$$

$$brf=-4095 \cdot X1/(X2-X1) \quad (5)$$

$$y=aif \cdot x(X1 \geq x) \quad (6)$$

$$y=aif \cdot X1(X2 \geq x>X1) \quad (7)$$

$$y=aif \cdot x+bif(x>X2) \quad (8)$$

$$aif=4095/(4095+X1-X2) \quad (9)$$

$$bif=(X1-X2)/(4095+X1-X2) \quad (10)$$

Described next are changes in the RF and IF level signals SLr and SLi when the digital broadcast wave RF is gradually increased from a relatively low level. When the digital broadcast wave RF is at a minimum level, the value x supplied to the RF/IF gain control signal generator 25a takes a maximum value, that is, 4095, and the RF and IF level signals SLr and SLi both become maximum, that is, 4095. Then, as the input level of the digital broadcast wave RF gradually increases, the value x is gradually decreased Where X2<x≦4095, the RF level signal SLr becomes constant at 4095 according to the above equation (3). The IF level signal SLi becomes gradually decreased from 4095 according to the above equation (8).

As the RF input signal is further increased to satisfy X1<x≦X2, the IF level signal SLi becomes constant at y=aif·X1 according to the above equation (7) (here, according to the above equation (9), aif=4095/(4095+X1−X2)).

Then, the RF level signal SLr is gradually decreased from 4095 according to the above equation (2).

As the RF input signal (−Za+OB) is further increased to satisfy 0<x≦X1, the RF level signal SLr becomes constant at 0 according to the above equation (1). The IF level signal SLi becomes gradually decreased from y=aif·x (aif=4095/(4095+X1−X2)) according to the above equation (6).

Note that, as described above, the RF level signal SLr is modulated in pulse width by the PWM 42r, converted into a DC voltage through the LPF 43r, and then used as the RF AGC signal SAGr for controlling the RF automatic gain controller 2. Also as described above, the IF level signal SLi is modulated in pulse width by the PWM 42i, converted into a DC voltage through the LPF 43i, and then used as the IF AGC signal SAGi for controlling the IF automatic gain controller 5.

Figure 5:
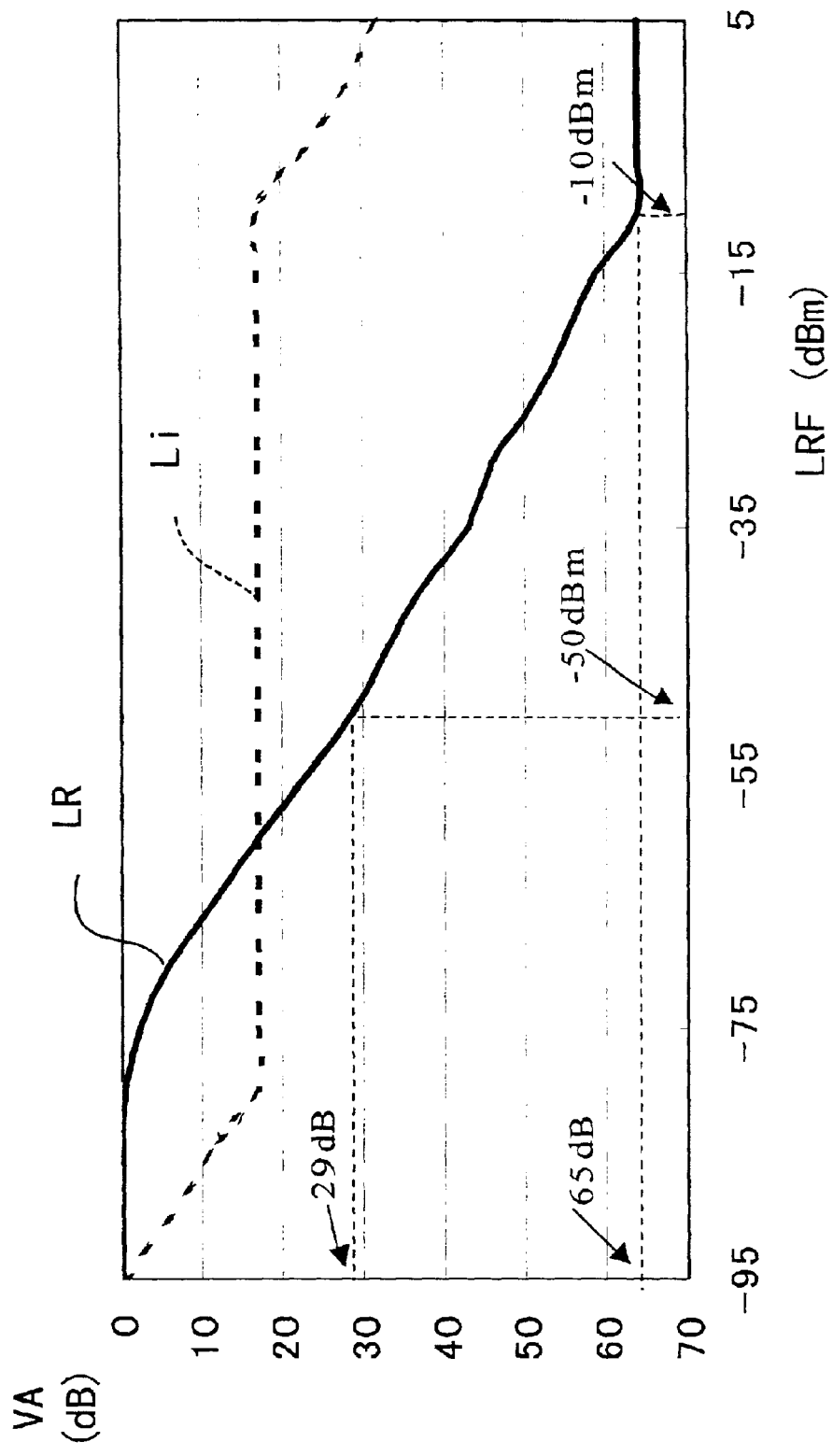
FIG. 5 is a diagram showing attenuation characteristics of an RF input signal level to an RF automatic gain controller and an IF automatic gain controller shown in FIG. 1.

Shown in FIG. 5 are changes in gain of the RF automatic gain controller 2 and the IF automatic gain controller 5 with respect to the digital broadcast wave RF in the present AGC apparatus. In FIG. 5, the vertical axis VA represents attenuation (dB) from maximum gain, while the lateral axis LRF represents the level of the digital broadcast wave RE. A solid line LR represents the attenuation of the RF automatic gain controller 2, while a dotted line Li represents the attenuation of the IF automatic gain controller 5.

Figure 18:
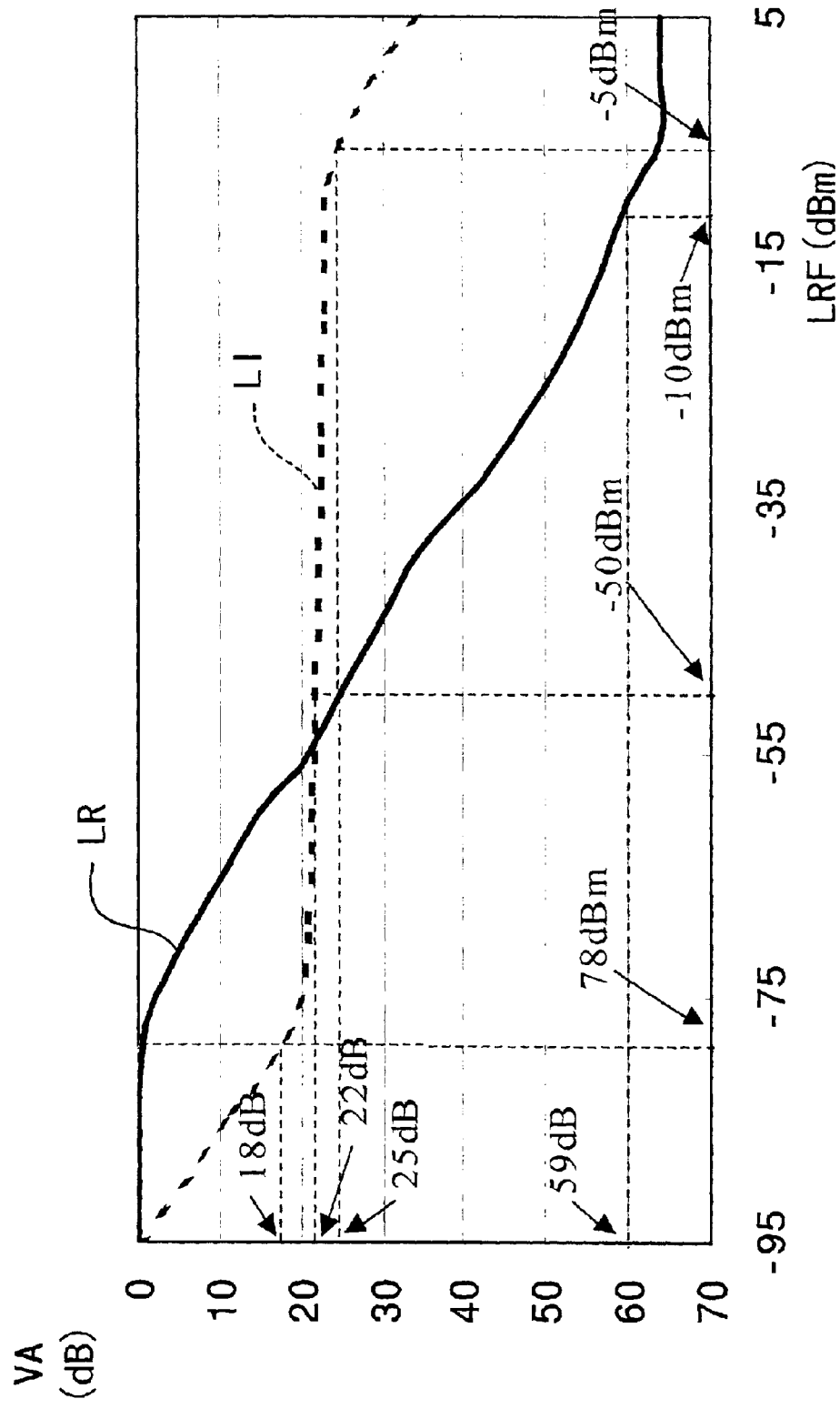
FIG. 18 is a diagram showing attenuation characteristics of an RF input signal level to an RF automatic gain controller and an IF automatic gain controller in the AGC apparatus shown in FIG. 14.

As is evident from the drawing, when the input level (LRF) is −50 dBm, the attenuation (LR) of the RF automatic gain controller 2 is 29 dB, which is 4 dB higher that of the conventional AGC apparatus AGC (25 dB, refer to FIG. 18). This means that the signal supplied to the mixer 3 is 4 dB lower in level than that of the conventional AGC apparatus AGC. That is, the AGC apparatus of the present embodiment can advantageously improve, by 4 dB, the capability of suppressing adjacent-channel interference, which is degraded at the mixer 3 by intermodulation-distortion interference in the conventional AGC apparatus AGC.

Moreover, in the present embodiment, when the input level (LRF) is −10 dBm, the attenuation (LR) of the RF automatic gain controller 2 is 65 dB, which is 6 dB higher than that of the conventional AGC apparatus AGC (59 dB, refer to FIG. 18). This means that the signal supplied to the mixer 3 is 6 dB lower in level than that of the conventional AGC apparatus AGC. That is, the AGC apparatus of the present embodiment can advantageously improve the capability of suppressing intermodulation-distortion interference that occurs in the mixer 3 at a high electric field.

Next, with reference to FIGS. 6, 7, 8, and 9, one example modification of the above AGC apparatus AGCa is described. An AGC apparatus AGCa' according to the present example modification is similar in structure to the AGC apparatus AGCa except that the RF/IF gain control signal generator 25a is replaced by an RF/IF gain control signal generator 25a'. Therefore, the structure of the AGC apparatus AGCa' is not described and illustrated in any drawing herein. However, the operation of the RF/IF gain control signal generator 25a' is slightly different from that of RF/IF gain control signal generator 25a, and therefore is now described below.

Figure 6:
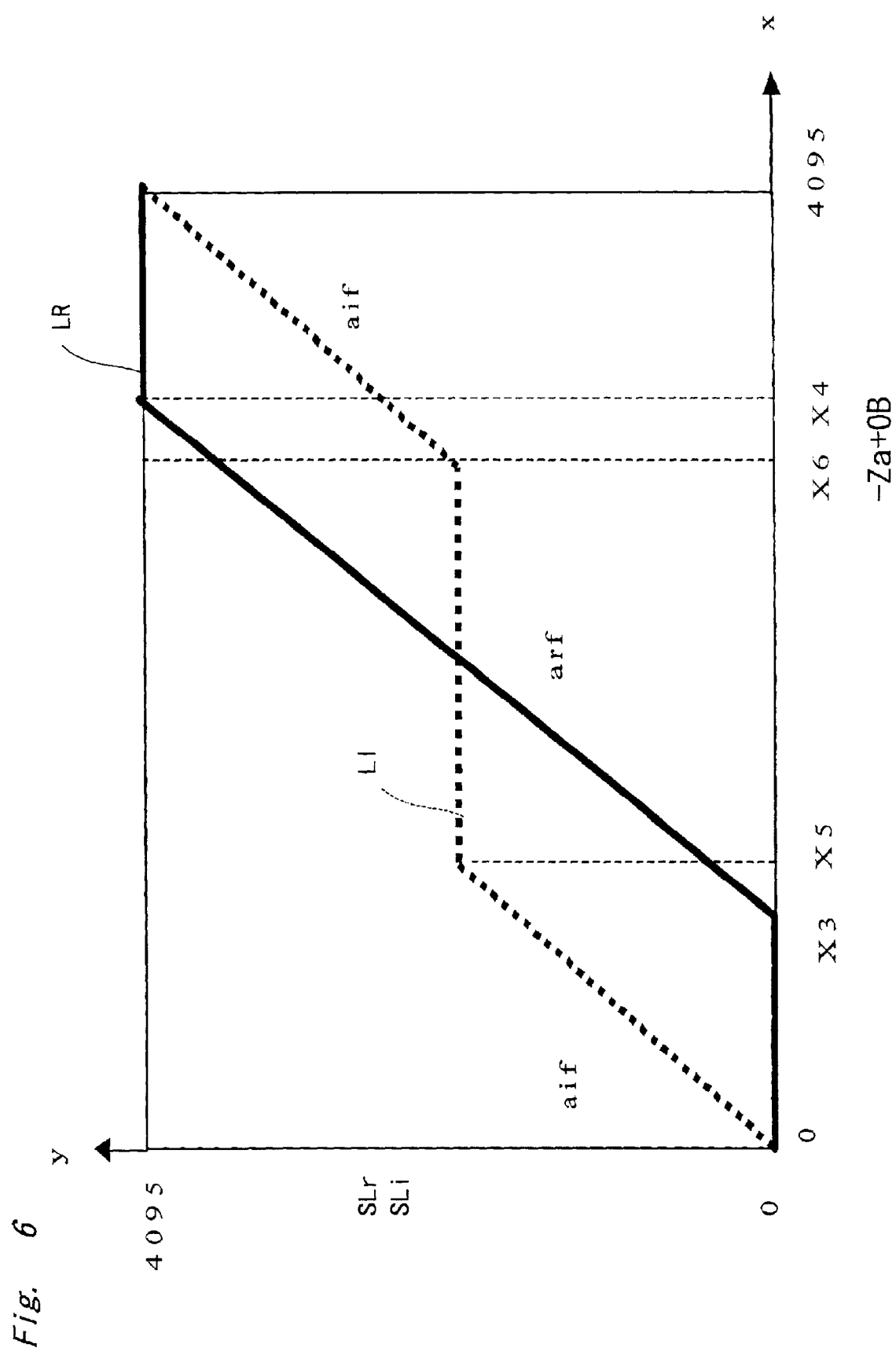
FIG. 6 is a diagram showing an input-to-output characteristic of the RF/IF gain control signal generator in one example modification of the AGC apparatus shown in FIG. 1.

With reference to FIG. 6, the operation of the RF/IF gain control signal generator 25a' is described. In FIG. 6, as with FIG. 4 referred to the above, a relation between the RF level signal SLr and the IF level signal SLi with respect to the signal (−Za+OB) supplied to the RF/IF gain control signal generator 25a'. The vertical axis represents the level of the RF level signal SLr and the IF level signal SLi, while the lateral axis represents the value of integrated signal Za+OB supplied to the RF/IF gain control signal generator 25a. A solid line LR represents the RF level signal SLr, while a dotted line LI represents the IF level signal SLi.

As is evident from the drawing, in the RF/IF gain control signal generator 25a', the value x, which is an input value of the RF/IF gain control signal generator 25a', is set to satisfy X3<x≦X4 in a range where the RF level signal SLr is changed, while X4<x≦4095 and x≦X3 in a range where the RF level signal SLr is kept constant. Also, the value x, is set to satisfy X4<x≦4095 and x≦X5 in a range where the IF level signal SLi is changed, while X5<x≦X6 in a range where the IF level signal SLi is kept constant.

As to the relation between the RF and IF level signals SLr and SLi with respect to the input in the above RF/IF gain control signal generator 25a', when the RF level signal SLr is constant (in the drawing, X4<x≦4095 and x≦X3), the IF level signal SLi is changed. When the IF level signal SLi is constant (in the drawing, X5<x<X6), the RF level signal SLr is changed. Where X3<x≦X5 and X6<x≦X4, the RF and IF level signals SLr and SLi are changed both. Therefore, the RF/IF gain control signal generator 25a controls them interrelated to each other while the RF/IF gain control signal generator 25a' can separately control the RF and IF level signals SLr and SLi.

In the RF/IF gain control signal generator 25a', the characteristic of the RF level signal SLr typified by the solid line LR is represented by the following equations (11), (12), (13), (14), and (15), while the characteristic of the IF level signal SLi typified by the dotted line LI is represented by the following equations (16), (17), (18), (19), and (20).

$$y=0(X3 \leq x) \tag{11}$$

$$y=aif \cdot x+brf(X4 \geq x>X3) \tag{12}$$

$$y=4095(x>X4) \tag{13}$$

$$arf=4095/(X4-X3) \tag{14}$$

$$brf=-4095 \cdot X3/(X4-X3) \tag{15}$$

$$y=aif \cdot x(X5 \geq x) \tag{16}$$

$$y=aif \cdot X5(X6 \geq x>X5) \tag{17}$$

$$y=aif \cdot x+bif(x>X6) \tag{18}$$

$$aif=4095/(4095+X5-X6) \tag{19}$$

$$bif=(X5-X6)/(4095+X5-X6) \tag{20}$$

With reference to FIG. 6, described next are the states of the RF and IF level signal SLr and SLi in the present example modification when the digital broadcast wave RF is gradually increased from a relatively low level. Also in FIG. 6, as with FIG. 4, the vertical axis represents the level of the RF level signal SLr and the IF level signal SLi, while the lateral axis represents the value of integrated signal Za+OB supplied to the RF/IF gain control signal generator 25a'. A solid line LR represents the RF level signal SLr, while a dotted line LI represents the IF level signal SLi. X3 and X4 on the lateral axis indicate values of Za+OB when the characteristic of the RF level signal SLr changes, while X5 and X6 thereon indicate values of Za+OB when the characteristic of the IF level signal SLi changes.

When the digital broadcast wave RF is at a minimum level, the value x supplied to the RF/IF gain control signal generator 25a' takes a maximum value, that is, 4095, and the RF and IF level signals SLr and SLi both become maximum, that is, 4095. Then, as the input level of the digital broadcast wave RF gradually increases, the value x supplied to the RF/IF gain control signal generator 25a' is gradually decreased. Where $X4<x\leq 4095$, the RF level signal SLr becomes constant at 4095 according to the above equation (13). The IF level signal SLi becomes gradually decreased from 4095 according to the above equation (18).

As the digital broadcast wave RF is further increased to satisfy $X6<x\leq X4$, the RF level signal SLr becomes gradually decreased from 4095 according to the above equation (12), and the IF level signal SLi also becomes gradually decreased according to the above equation (18). In short, the RF and IF level signals SLr and SLi are both changed in a range $X6<x\leq X4$. As the digital broadcast wave RF is further increased to satisfy $X5<x\leq X6$, the RF level signal SLr is further gradually decreased according to the above equation (12). The IF level signal SLi becomes constant at $y=aif\cdot X5$ (here, $aif=4095/(4095+X5-X6)$) according to the above equation (17).

As the digital broadcast wave RF is still further increased to satisfy $X3<x\leq X5$, the RF level signal SLr is further gradually decreased according to the above equation (12), and the IF level signal SLi also becomes gradually decreased from $y=aif\cdot X5$ (here, $aif=4095/(4095+X5-X6)$) according to the above equation (16). In short, the RF and IF level signals SLr and SLi are both changed in a range $X3<x\leq X5$. As the digital broadcast wave RF is still further increased to satisfy $0<x\leq X3$, the RF level signal SLr becomes constant at 0 according to the above equation (11), and the IF level signal SLi is further gradually decreased according to the above equation (16).

Figure 7:
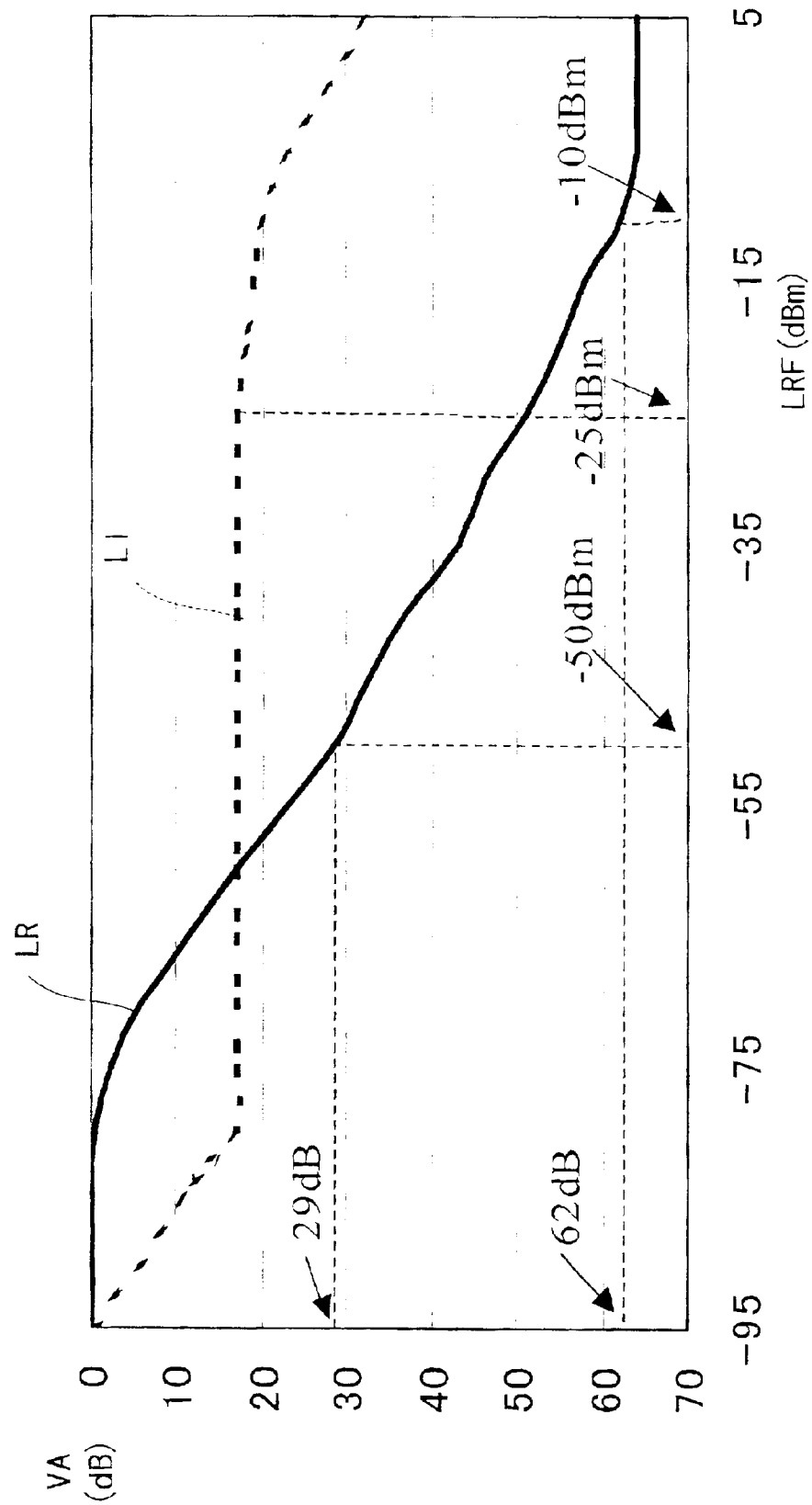
FIG. 7 is a diagram showing attenuation characteristics of an RF input signal level to an RF automatic gain controller and an IF automatic gain controller in the modification example of the AGC apparatus shown in FIG. 1.

With reference to FIG. 7, described is attenuation characteristics of the RF automatic gain controller 2 and the IF automatic gain controller 5 with respect to the input level of the digital broadcast wave RF in the present invention if $X4=X6$.

Figure 9:
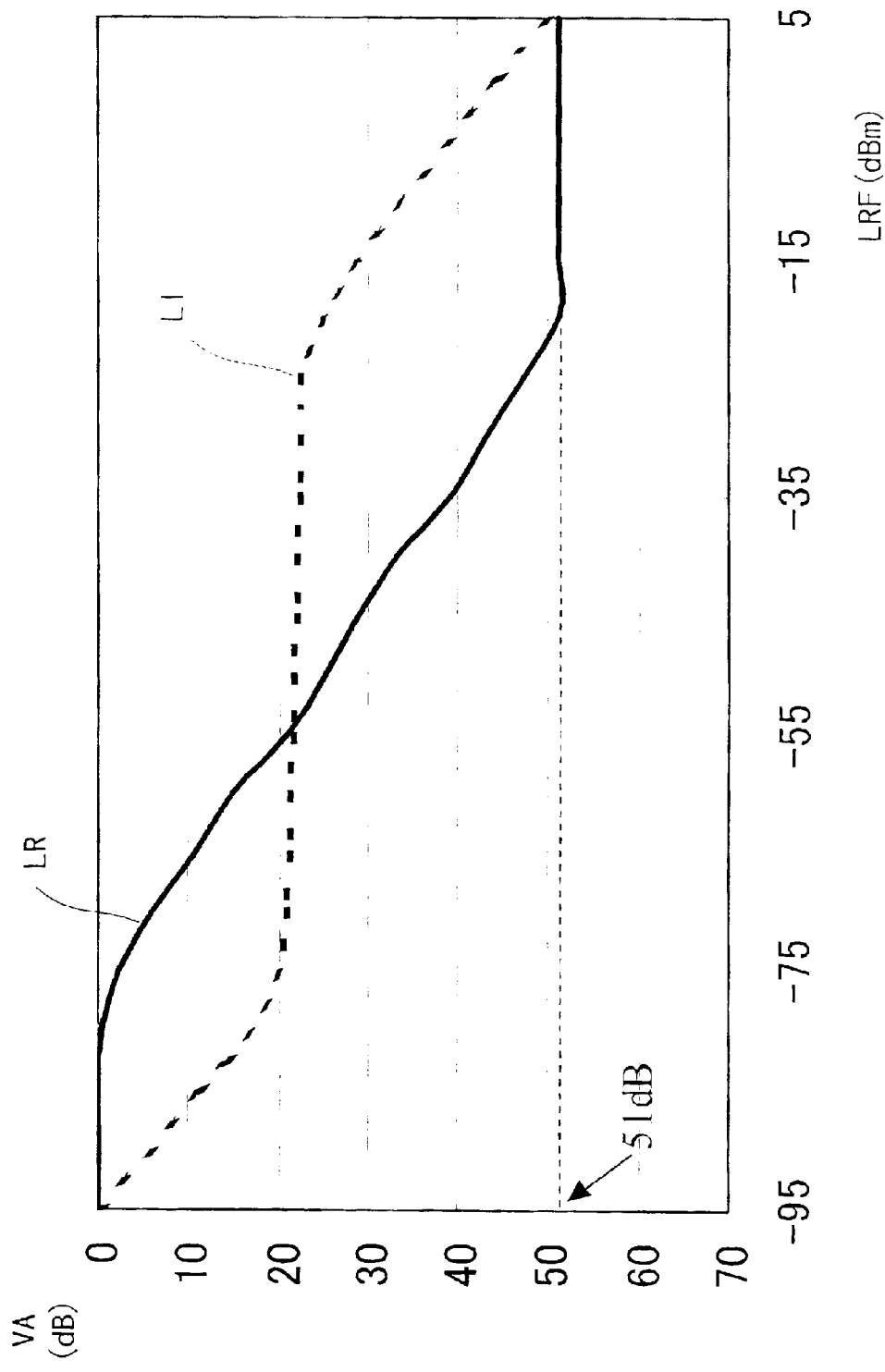
FIG. 9 is a diagram showing attenuation characteristics of the RF input signal level to the RF automatic gain controller and the IF automatic gain controller, when the attenuation of the RF automatic gain controller is relatively small due to variations in quality of the tuner.
Figure 19:
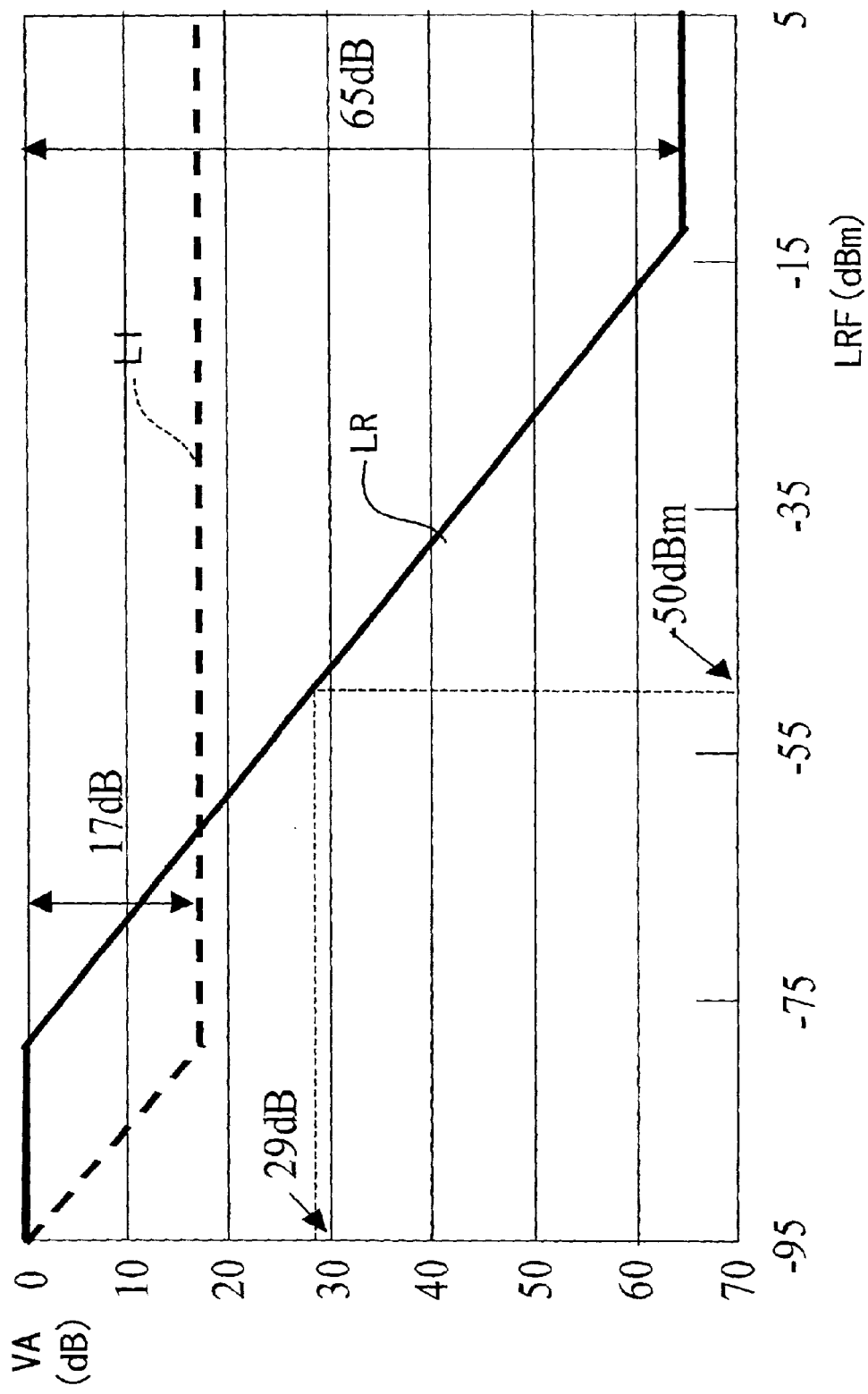
FIG. 19 is a diagram showing attenuation characteristics of an RF input signal level to an RF automatic gain controller and an IF automatic gain controller in the AGC apparatuses disclosed in Japanese Patent Gazettes Nos. 2699698 and 2778260, when suppressing adjacent-channel interference is of primary concern.

Due to variations in quality of the tuner 30, the (gain) attenuation of the RF automatic gain controller 2 is varied according to the tuner 30, in some cases. For example, in the conventional AGC apparatus AGC, the maximum attenuation of the RF automatic gain controller 2 is 51 dB as shown in FIG. 9, and 65 dB as shown in FIG. 19. Also in the AGC apparatus AGCa of the present embodiment, the maximum attenuation thereof is 51 dB as shown in FIG. 9, and 65 dB as shown in FIG. 5.

Figure 8:
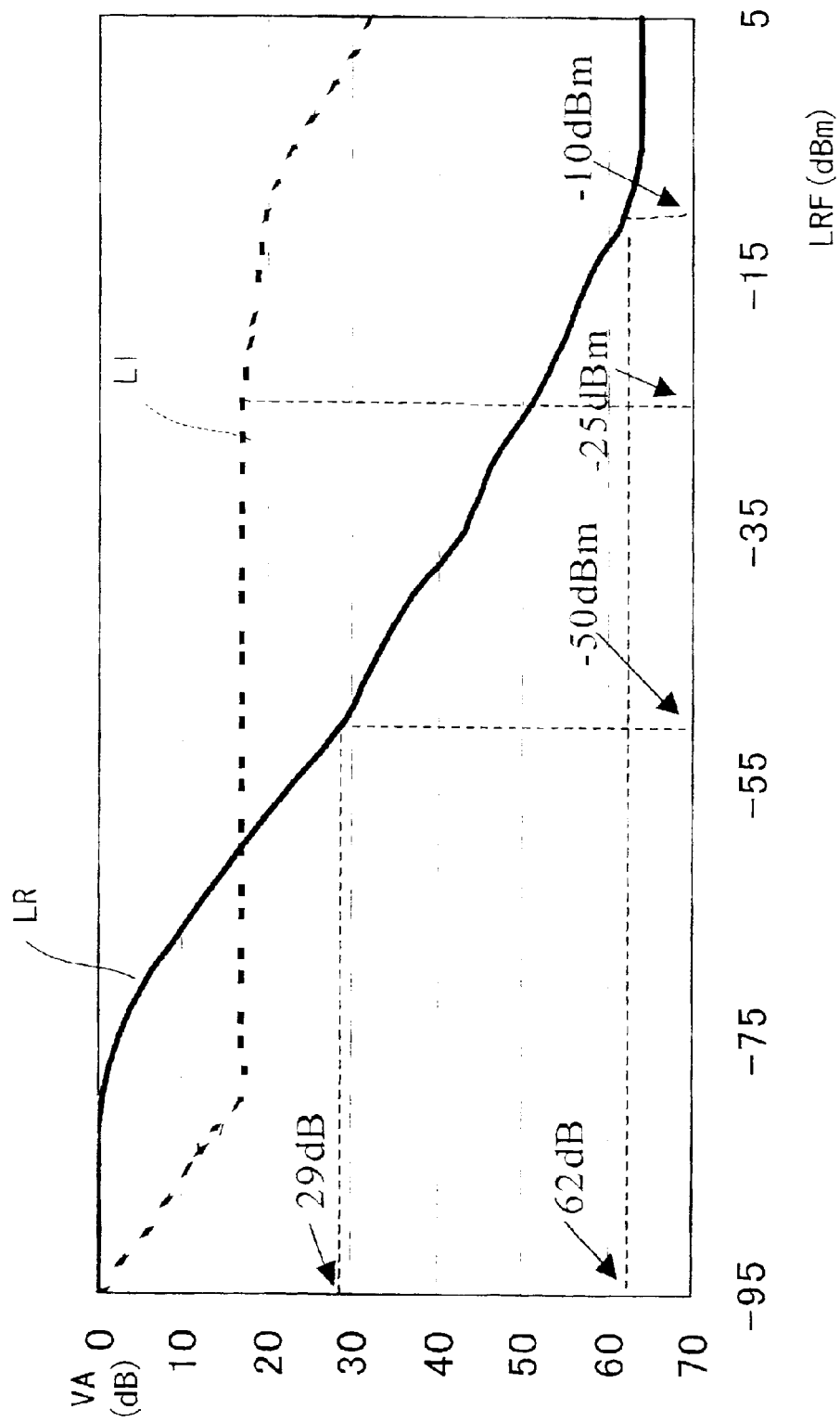
FIG. 8 is a diagram showing attenuation characteristics of the RF input signal level to the RF automatic gain controller and the IF automatic gain controller in the example modification of the AGC apparatus shown in FIG. 1, when the attenuation of the RF automatic gain controller is relatively small due to variations in quality of a tuner.

In the above AGC apparatus AGCa, if the attenuation of the RF automatic gain controller 2 in the tuner 30 is varied, the RF/IF gain control signal generator 25a has to carry out control in accordance with the minimum attenuation of the RF automatic gain controller 2, as shown in FIG. 8. That is, even if the RF automatic gain controller 2 is capable of carrying out attenuation up to 65 dB as shown in FIG. 5, the values of X1 and X2 in FIG. 4 have to be determined in accordance with the minimum attenuation of 51 dB as shown in FIG. 9.

Consider a case where the values of X1 and X2 shown in FIG. 4 are determined based on the assumption that the attenuation of the RF automatic gain controller 2 is 65 dB as shown in FIG. 5 and does not varied. In this case, in the range $X1<x\leq X1'$ where the RF level signal SLr is changed as shown in FIG. 4, the actual attenuation of the automatic gain controller 2 of the tuner 30 varied in quality is slightly over 51 dB, but then plateaued at 51 dB.

That is, $X1<x\leq X1'$ shown in FIG. 4, there exists a problem that no change is observed in both of the attenuations of the RF automatic gain controller 2 and the IF automatic gain controller 5. Furthermore, when the values of X1 and X2 shown in FIG. 4 are determined, based on the assumption that the attenuation of the RF automatic gain controller 2 is 65 dB as shown in FIG. 5 and does not vary, the tuner 30 whose attenuation of the RF automatic gain controller 2 is over 65 dB has to be selected, leading to an increase in cost of the tuner 30.

In the example embodiment as shown in FIG. 6, if the RF/IF gain control signal generator 25a separately controls the RF level signal SLr and IF level signal SLi, such problems as described above in the first embodiment can be solved. More specifically, as shown in FIG. 7, the RF and IF automatic gain controller 2 and 5 both operate in the range of −25 dBm to −10 dBm of the digital broadcast wave RF. With such operation, the attenuation of the RF automatic controller 2 is 29 dB at −50 dBm of the digital broadcast wave RF. This attenuation is 4 dB larger than that in the conventional AGC apparatus AGC shown in FIG. 14, that is, 25 dB. That is, in the present invention, the level of the signal supplied to the mixer 3 is 4 dB lower than that of the conventional apparatus, thereby improving, by 4 dB, the capability of suppressing adjacent-channel interference at the mixer 3 due to intermodulation-distortion interference.

Figure 14:
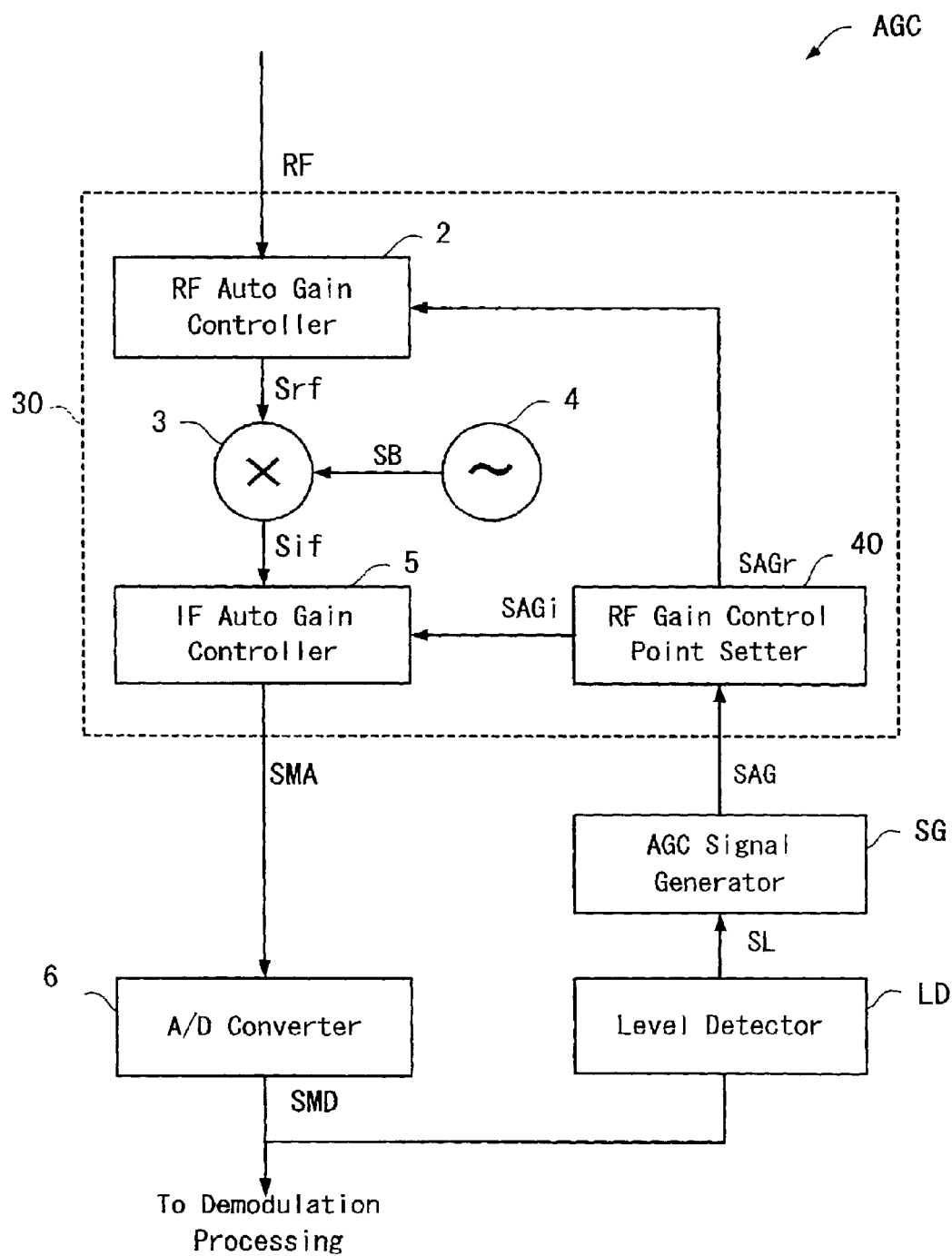
FIG. 14 is a block diagram showing the structure of a conventional AGC apparatus.

Further, the attenuation of the RF automatic gain controller 2 at −10 dBm of the digital broadcast wave RF is 59 dB, as shown in FIG. 18, in the conventional example shown in FIG. 14, while 62 dB in the present embodiment. That is, the level of the signal supplied to the mixer 3 is 3 dB lower than that of the conventional apparatus, thereby improving, by 3 dB, the capability of suppressing the intermodulation-distortion interference degraded at the mixer.

(Second Embodiment)

Figure 10:
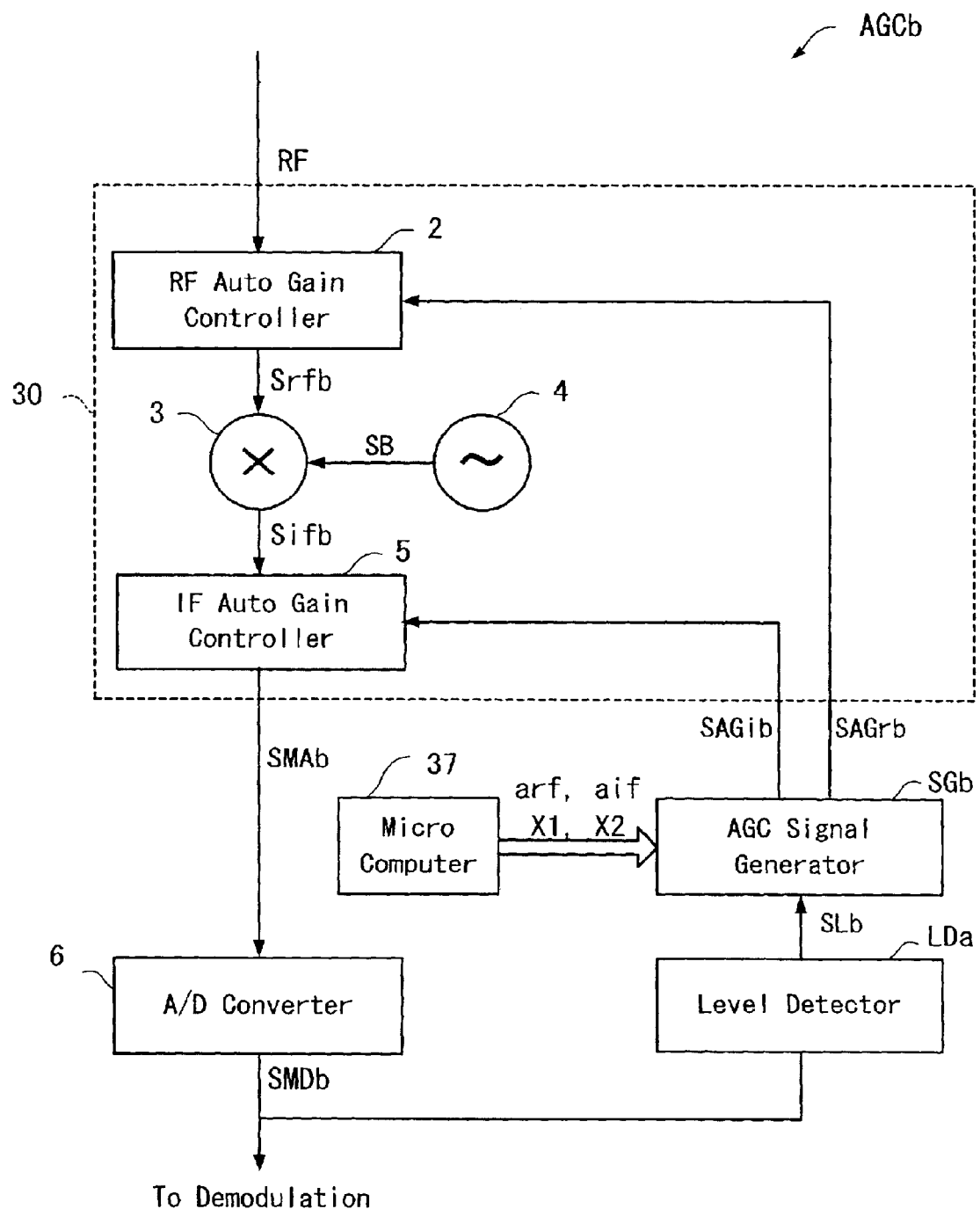
FIG. 10 is a block diagram showing the structure of an AGC apparatus according to a second embodiment of the present invention.
Figure 11:
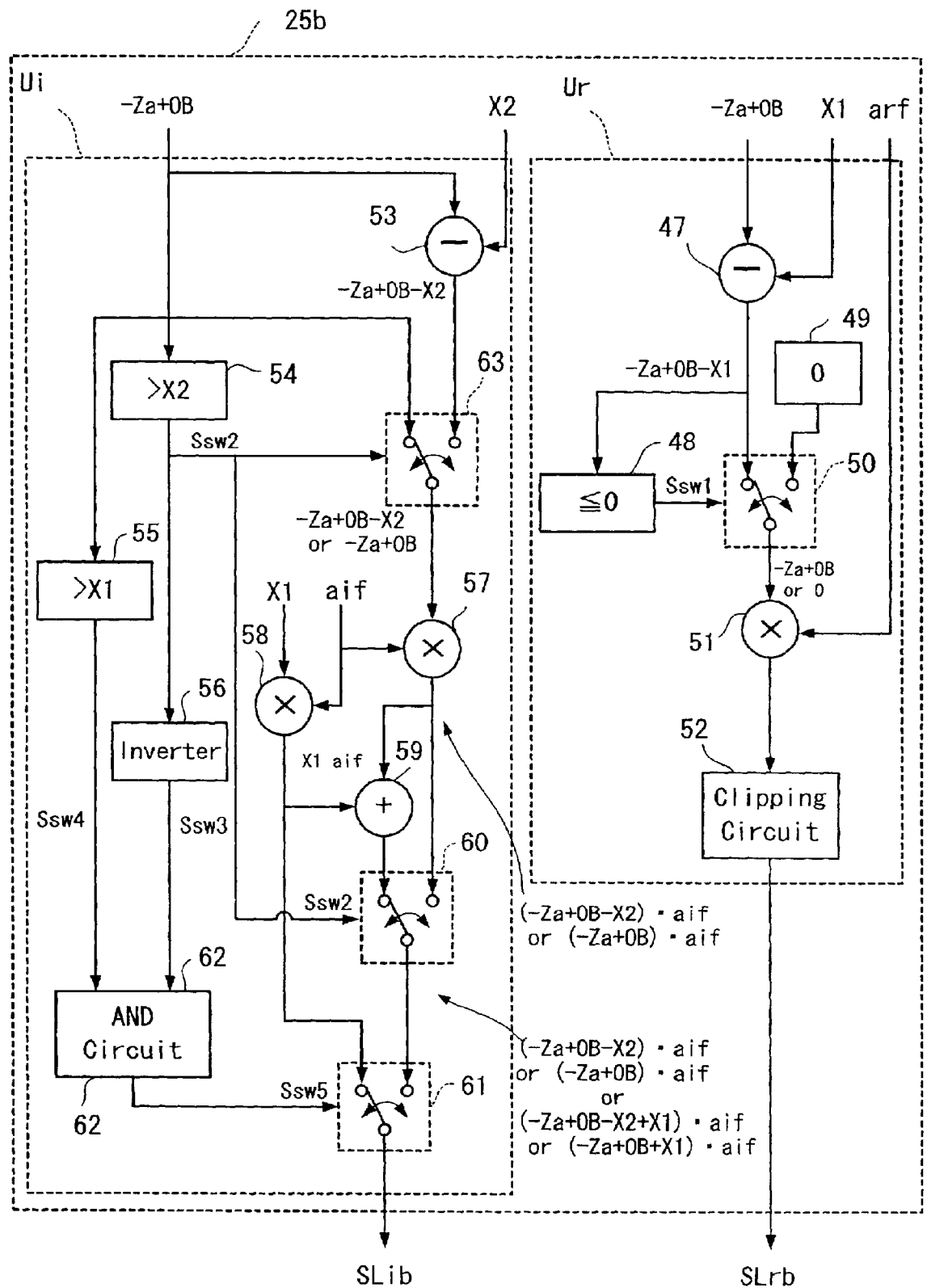
FIG. 11 is a block diagram showing the structure of an RF/IF gain control signal generator shown in FIG. 10.

With reference to FIGS. 10 and 11, described below is the AGC apparatus of the second embodiment of the present invention. Prior to that, the basic concept of the AGC apparatus according to the second embodiment is first described. The characteristics of the AGC apparatus AGCa according to the first embodiment shown in FIG. 4 can be originally achieved if the parameters X1 and X2 in the above equations (1), (2), (3), (4), (5), (6), (7), (8), (9), and (10) are known. However, in addition to these parameters X1 and X2, the gradients arf and aif, and points of intersection of the RF and IF level signals and the y axis brf and bif are required. Therefore, it is obvious from the equations (4), (5), (9), and (10) that dividers are required.

As long as these parameters X1, X2, arf, and aif are known, the characteristics shown in FIG. 4 can be achieved without using such dividers. Therefore, if any parameter setting means such as a microcomputer that can provide and set these parameters is added, the desired gain characteristics can be realized without requiring dividers.

An AGC apparatus AGCb according to the present embodiment is similar in structure to the AGC apparatus AGCa, except that an AGC signal generator SGb is provided in place of the AGC signal generator SGa, and a microcomputer is newly added. The AGC signal generator SGb is similar in structure to the AGC signal generator SGa, except that an RF/IF gain control signal generator 25b is provided in place of the RF/IF gain control signal generator 25a. A microcomputer 37 is provided as means for providing and setting the above stated parameters X1, X2, arf, and aif to the AGC signal generator SGb. Therefore, the structure and operation similar to that of the AGC apparatus AGCa are not described herein, and only the RF/IF gain control signal generator 25b unique to the present embodiment is described herein.

With reference to FIG. 11, the RF/IF gain control signal generator 25b is described. The RF/IF gain control signal generator 25b mainly includes an RF level signal generator Ur for generating an RF level signal SLr and an IF level signal generator Ui for generating an IF level signal SLi.

Such signal generation in both of the generators are based on the input from the level converter LC.

The RF level signal generator Ur includes a subtractor 47, a comparator 48, a 0-value provider 49, a switch 50, a multiplier 51, and a clipping circuit 52. The subtractor 47 is connected to the adder 38 of the level converter LC and to the microcomputer 37. The subtractor 47 subtracts X1 supplied by the microcomputer 37 from the −Za+OB supplied by the level converter LC, and generates −Za+OB−X1.

From a value x of −Za+OB supplied to the RF/IF gain control signal generator 25b, X1 is subtracted by the subtractor 47, and −Za+OB−X1 is generated. The comparator 48 determines whether the value (level) of −Za+OB−X1 outputted from the subtractor 47 is equal to or smaller than 0, and generates a first level decision signal Ssw1. The switch 50 is connected to an output port of the 0-value provider 49, an output port of the subtractor 47, and an output port of the comparator 48. The switch 50 selects, based on the first level decision signal Ssw1 outputted from the comparator 48, either one of the output ports of the subtractor 47 and the 0-value provider 49, and then connects the selected one to an input port of the multiplier 51.

As a result, the multiplier 51 receives either one of −Za+OB−X1 supplied by the subtractor 47 and a value of 0 provided by the 0-value provider 49. In more detail, if the output of the subtractor 47 is equal to or smaller than 0, the switch 50 outputs the value of 0, and otherwise, the switch 50 outputs the same value outputted from the subtractor 47. The output value from the switch 50 is multiplied by arf in the multiplexer 51. If the multiplication result is larger than 4095, the result (the output value from the multiplier 51) is clipped, and a value of 4095 is outputted as the RF level signal SLrb.

As to the above equation (1), when $x \leq X1$, the value of 0 is outputted from the multiplier 51, goes through the multiplier 51 and the clipping circuit 52, and the resultant RF level signal SLrb becomes 0. As to the above equations (2), (3), (4), and (5), when $X1 < x \leq X2$, the output value x−X1 from the subtractor 47 is outputted from the switch 50, and arf·(x−X1) is outputted from the multiplier 51. From the clipping circuit 52, arf·(x−X1), that is, arf·x+brf=arf·(x−X1) in the above (1), (2), (3), (4), and (5), is outputted. When $X2 \leq x$, the output value from the subtractor 47 is outputted from the switch 50, arf·(x−X1) is outputted from the multiplier 51, and a value obtained by clipping arf·(x−X1), that is, 4095, is outputted from the clipping circuit 52.

The IF level signal generator Ui includes a subtractor 53, a comparator 54, (in FIG. 11, denoted as ">X2"), a comparator 55 (in FIG. 11, denoted as ">X1"), an inverter 56, a multiplier 57, a multiplier 58, an adder 59, a switch 60, a switch 61, an AND circuit 62, and a switch 63.

From the input value x of the RF/IF gain control signal generator 25b, X2 is subtracted by the subtractor 53, and −Za+OB−X2 is generated. The comparator 54 determines whether the value (level) of −Za+OB−X2 is larger than X2, and generates a second level decision signal Ssw2. The switch 63 is connected to an output port of the adder 38, an output port of the subtractor 53, and an output port of the comparator 54. The switch 63 selects, based on the second level decision signal Ssw2 outputted from the comparator 54, either one of the output ports of the adder 38 and the subtractor 53, and then connects the selected one to an input port of the multiplier 57.

That is, if the value x (−Za+OB) supplied to the RF/IF gain control signal generator 25b is larger than X2, the switch 63 outputs the output value x−X2 (−Za+OB−X2) from the subtractor 53. If the value x is equal to or smaller than X2, the switch 63 outputs, to the multiplier 57, the input value x (−Za+OB) to the RF/IF gain control signal generator 25b. The multiplier 57 multiplies the output value x (−Za+OB or −Za+OB−X2) by aif from the microcomputer 37 to generate (−Za+OB)·aif or (−Za+OB−X2)·aif.

The multiplier 58 multiplies X1 by aif, both supplied by the microcomputer 37 to generate aif·X1. The adder 59 adds the (−Za+OB)·aif or (−Za+OB−X2)·aif supplied by the multiplier 57 to aif·X1 supplied by the multiplier 58 to generate (−Za+OB+X1)·aif or (−Za+OB−X2+X1)·aif.

The switch 60 is connected to an output port of the multiplier 57, an output port of the adder 59, and the output port of the comparator 54, and also to an input port of the switch 61. The switch 60 outputs to the input port of the switch 61, based on the second level decision signal Ssw2 supplied by the comparator 54, either one of (−Za+OB+X1)·aif and (−Za+OB−X2+X1)·aif supplied by the adder 59 or either one of (−Za+OB)·aif or (−Za+OB−X2)·aif supplied by the multiplier 57.

That is, if the value x (−Za+OB) supplied to the RF/IF gain control signal generator 25b is larger than X2, the switch 60 outputs (−Za+OB−X2+X1)·aif. If the value x is equal to or smaller than X2, the switch 60 outputs (−Za+OB)·aif.

Furthermore, the comparator 55 determines whether the value x (−Za+OB) outputted from the adder 38 is larger than X1, and generates a fourth level decision signal Ssw4 to the AND circuit 62. The inverter 56 inverts the second level decision signal Ssw2 into a third level decision signal Ssw3, and outputs it to the AND circuit 62.

When the value x (−Za+OB) outputted from the adder 38 is larger than X1, the fourth level decision signal Ssw4=1. When $x \leq X2$, Ssw4=0. When $x \leq X2$, the second level decision signal Ssw2=0, and the third level decision signal Ssw3=1. When $x > X2$, the second level decision signal Ssw2=1, and the third level decision signal Ssw3=0. That is, if $X1 < x \leq X2$, the output from the AND circuit 62, that is, a fifth level decision signal Ssw5 becomes 1, and otherwise, becomes 0.

The switch 61 is connected to the output port of the multiplier 58, an output port of the switch 60, and an output port of the AND circuit 62. The switch 61 outputs, based on the fifth level decision signal Ssw5 outputted from the AND circuit 62, aif·X1 or either one of (−Za+OB)·aif and (−Za+OB−X2+X1)·aif outputted from the switch 60, as the IF level signal SLib, to the PWM 42i.

That is, when the value x (−Za+OB) supplied to the RF/IF gain control signal generator 25b satisfies $X1 < x \leq X2$, the switch 61 outputs aif·X1 outputted to the multiplier 58 as the IF level signal SLib. When $x \leq X1$ or $X2 < x$, the switch 61 outputs as the IF level signal SLib either one of (−Za+OB)·aif and (−Za+OB−X2+X1)·aif outputted from the switch 60.

In other words, in the equations (5), (6), (7), (8) and (9), when $x \leq X1$, the switch 63 outputs the input value x (−Za+OB) itself. Then, the multiplier 57 outputs aif·(−Za+OB) After going though the switches 60 and 61, the IF level signal SLib becomes aif·x.

In the equations (1), (2), (3), (4), and (5), when $x > X2$, the switch 63 outputs the output value −Za+OB−X2 from the subtractor 53. Then, the multiplier 57 outputs aif·(−Za+OB−X2), and then the adder 59 outputs aif·(−Za+OB−X2+X1). After going though the switches 60 and 61, the IF level signal SLib becomes aif·(−Za+OB−X2+X1).

As described in the foregoing, the AGC apparatus AGCb is so structured as follows: The values of X1 and X2 are determined in advance. Based on X1, X2, and also the equations (4) and (9), arf and aif are derived. These parameter X1, X2, arf, and aif are then provided from the microcomputer 37 through an IC bus to the RF/IF gain control signal generator 25b in the AGC signal generator SGb. Consequently, no divider is required for structuring the RF/IF gain control signal generator 25b, thereby reducing the circuit size.

Figure 12:
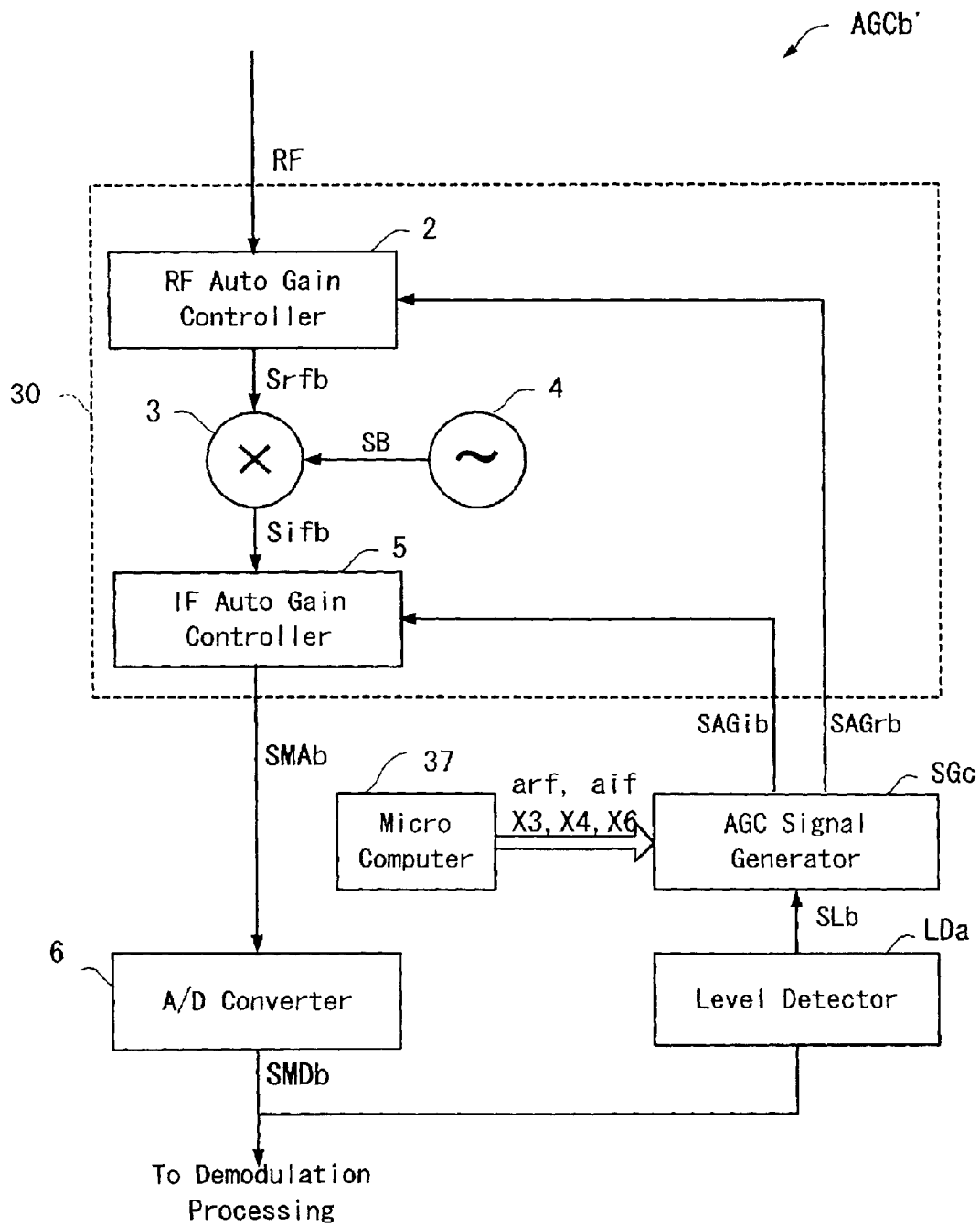
FIG. 12 is a diagram showing one example modification of the AGC apparatus shown in FIG. 10.
Figure 13:
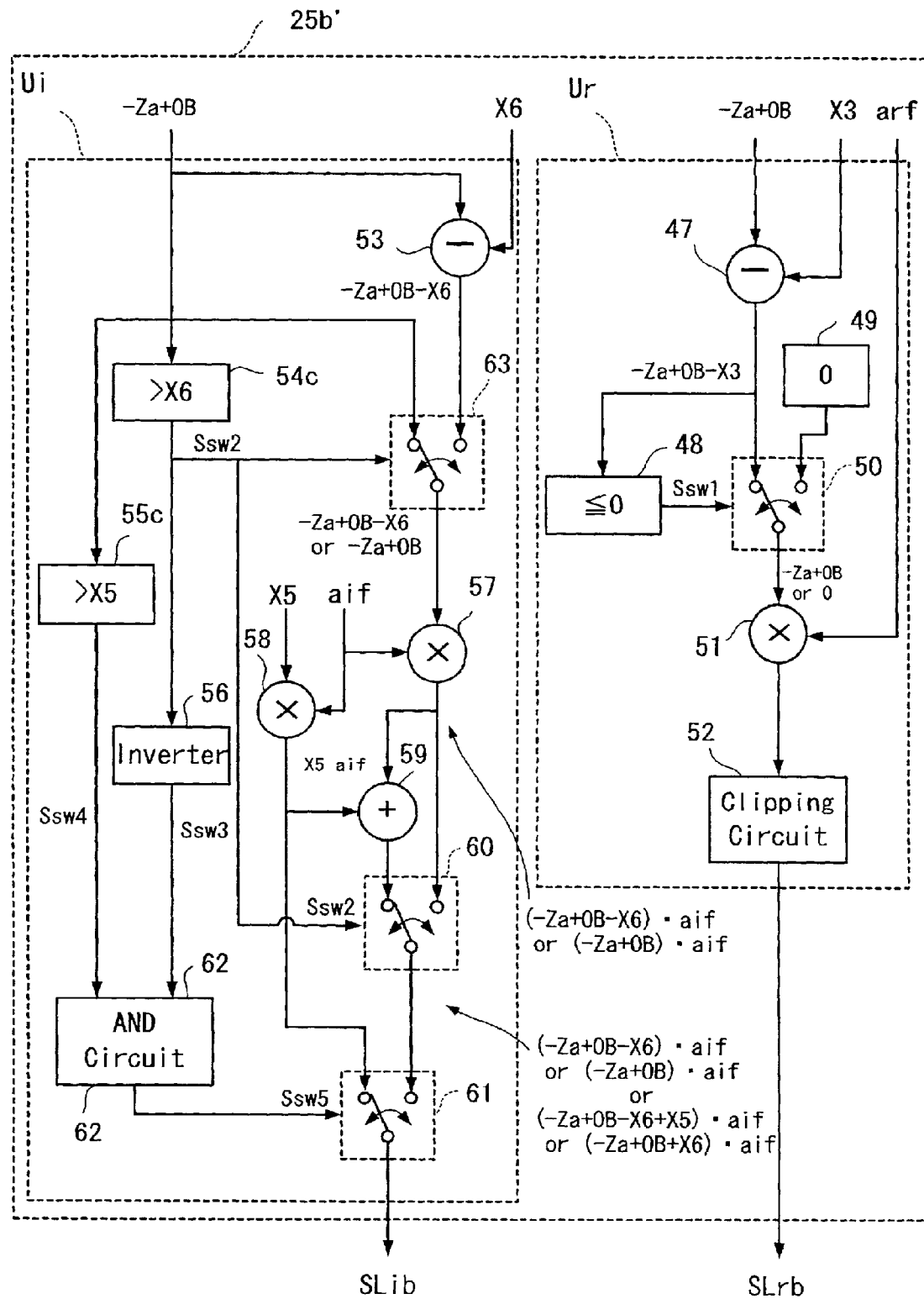
FIG. 13 is a block diagram showing the structure of an RF/IF gain control signal generator as shown in FIG. 12.

With reference to FIGS. 12 and 13, an example modification of the AGC apparatus AGCb according to the above second embodiment is described. As with the AGC apparatus AGCb, an AGC apparatus of the example modification achieves the characteristics shown in FIG. 6 without using dividers. That is, the characteristics of the AGC apparatus AGCa shown in FIG. 6 can be realized as long as the parameters X3 and X4 in the equations (11), (12), (13), (14), and (15) and the parameters X5 and X6 in the equations (16), (17), (18), (19), and (20) are known.

However, in addition to these parameters X3, X4, X5, and X6, required are the gradients arf and aif, and points of intersection of the RF and IF level signals and the y axis brf and bif in the equations (12), (14), (15), (16), (17), (18), (19), and (20). Therefore, it is obvious from the equations (14), (15), (19), and (20) that dividers are required. As long as the parameters X3, and arf are known, the characteristic of the RF/IF gain control signal generator input to the RF level signal can be obtained. Also, as long as the parameters X5, X6, and aif are known, the characteristic of the RF/IF gain control signal generator input to the IF level signal can be obtained. Therefore, if any parameter setting means such as a microcomputer that can provide and set these parameters is added, the desired gain characteristics can be realized without requiring dividers.

Illustrated in FIG. 13 is the processing in the components of an RF/IF gain control signal generator 25b' structured in the above manner, and the operation of these components is briefly described below. An AGC apparatus AGCb' according to the example embodiment is similar in structure and operation to the AGC apparatus AGCb, except that the parameters X3, X5, and X6 are set by the microcomputer. However, the subtractor 47 of the AGC apparatus AGCb' is provided with X3 instead of X1, the subtractor 53 is provided with X6 instead of X2, and the multiplier 58 is provided with X5 instead of X1. As a result, a comparator 54c is replaced by the comparator 54, and a comparator 55c is by the comparator 55. Note that, when the value x (−Za+OB) supplied by the adder 38 is larger than X5, the fourth level decision signal Ssw4=1. When x≦X5, Ssw4=0. When x≦X6, Ssw2=0, and Ssw3=1. When x>X6, Ssw2=1, and Ssw3=1. When X5<x or x≦X6, the fifth level decision signal Ssw5 from the AND circuit 62 becomes 1. When X6<x or x≦X5, Ssw5=0.

As with the RF/IF gain control signal generator 25b, in the RF/IF gain control signal generator 25b', the multiplier 35, the subtractor 53, and the multiplier 58 find arf and aif based on the X3, X5, and X6 provided by the microcomputer 37, by using the equations (14) and (19). Then, X3, X5, and X6 provided through the IC bus by microcomputer 37 and the found arf and aif are transferred to the RF/IF gain control signal generator 25b. Consequently, no divider is required for structuring the RF/IF gain control signal generator 25b, thereby reducing the circuit size.

As described in the foregoing, in the present invention, if the gain of the RF automatic gain controller is attenuated, the gain of the IF automatic gain controller is made constant, and vice versa. Therefore, the capabilities of suppressing adjacent-channel interference and intermodulation-distortion interference can be improved in consideration of variations in quality of the tuner. Moreover, the parameters required for the RF/IF gain control signal generator that determine the operation of the RF and IF automatic gain controller are set by the microcomputer. Thus, the circuit size can be reduced.

While the invention has been described in detail, the foregoing description is in all aspects illustrative and not restrictive. It is understood that numerous other modifications and variations can be devised without departing from the scope of the invention.

What is claimed is:

1. An automatic gain control apparatus, comprising:
   an RF automatic gain controller operable to control a gain of a radio frequency signal;
   a frequency converter operable to frequency convert the radio frequency signal into an intermediate frequency signal;
   an IF automatic gain controller operable to control a gain of the intermediate frequency signal;
   a level detector operable to detect a signal level of the intermediate frequency signal with the gain controlled, and operable to generate a level signal; and
   an automatic gain control signal generator operable to generate, based on the level signal, an RF automatic gain control signal for controlling said RF automatic gain controller and an IF automatic gain control signal for controlling said IF automatic gain controller, so as to separately control said RF automatic gain controller and said IF automatic gain controller,
   wherein said automatic gain control signal generator either fixes the gain of said IF automatic gain controller if a level, indicated by the level signal, is higher than one of a plurality of predetermined levels and lower than or equal to another one of the plurality of predetermined levels, or else changes the gain of said IF automatic gain controller.

2. The automatic gain control apparatus according to claim 1, wherein
   if said level signal indicates a level equal to or lower than a first predetermined level, said automatic gain control signal generator fixes the gain of said RF automatic gain controller to a maximum value, and changes the gain of said IF automatic gain controller,
   if said level signal indicates a level higher than said first predetermined level and equal to or lower than a second predetermined level, said automatic gain control signal generator fixes the gain of said IF automatic gain controller to the first predetermined value, and changes the gain of said RF automatic gain controller, and
   if said level signal indicates a level higher than said second predetermined level, said automatic gain control signal generator fixes the gain of said RF automatic gain controller to a second predetermined value, and changes the gain of said IF automatic gain controller.

3. The automatic gain control apparatus according to claim 2, further comprising:
   a microcomputer for setting the first and second predetermined levels at which the gain of said RF automatic gain controller and the gain of said IF automatic gain controller is changed or fixed, a parameter indicating a gradient of the radio frequency signal to the RF automatic gain control signal while the gain of said RF automatic gain controller is changed, and a parameter indicating a gradient of the radio frequency signal to the IF automatic gain control signal while the gain of said IF automatic gain controller is changed.

4. The automatic gain control apparatus according to claim 1, wherein if said level signal indicates a level equal to or lower than a third predetermined level, said automatic gain control signal generator fixes the gain of said RF automatic gain controller to a maximum value, if said level signal indicates a level higher than said third predetermined level and equal to or lower than a fourth predetermined level, the automatic gain control signal generator changes the gain of said RF automatic gain controller, if said level signal indicates a level higher than said fourth predetermined level, the automatic gain control signal generator fixes the gain of said RF automatic gain controller to a third predetermined value, if said level signal indicates a level equal to or lower than a fifth predetermined level, the automatic gain control signal generator changes the gain of said IF automatic gain controller, if said level signal indicates a level higher than said fifth predetermined level and equal to or lower than a sixth predetermined level, the automatic gain control signal generator fixes the gain of said IF automatic gain controller to a fourth predetermined value, and if said level signal indicates a level higher than said sixth predetermined level, the automatic gain control signal generator changes the gain of said IF automatic gain controller.

5. The automatic gain control apparatus according to claim 4, further comprising:

a microcomputer for setting the third and fourth predetermined levels at which the gain of said RF automatic gain controller is changed or fixed according to said radio frequency signal, the fifth and sixth predetermined levels at which the gain of said IF automatic gain controller is changed or fixed according to said radio frequency signal, a parameter indicating a gradient of the radio frequency signal to the RF automatic gain control signal while the gain of said RF automatic gain controller is changed, and a parameter indicating a gradient of the radio frequency signal to the IF automatic gain control signal while the gain of said IF automatic gain controller is changed.

* * * * *